(12) United States Patent
Nagai et al.

(10) Patent No.: US 8,564,666 B2
(45) Date of Patent: *Oct. 22, 2013

(54) IMAGE PICKUP DEVICE, VISIBILITY SUPPORT APPARATUS, NIGHT VISION DEVICE, NAVIGATION SUPPORT APPARATUS, AND MONITORING DEVICE

(75) Inventors: Youichi Nagai, Osaka (JP); Yasuhiro Iguchi, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/548,668

(22) Filed: Jul. 13, 2012

(65) Prior Publication Data

US 2012/0274771 A1 Nov. 1, 2012

Related U.S. Application Data

(63) Continuation of application No. 13/063,444, filed as application No. PCT/JP2009/063246 on Jul. 24, 2009, now Pat. No. 8,243,139.

(30) Foreign Application Priority Data

Sep. 11, 2008 (JP) ................................. 2008-233948

(51) Int. Cl.
*H04N 7/18* (2006.01)

(52) U.S. Cl.
USPC .......................................... 348/148; 348/143

(58) Field of Classification Search
USPC .................................................. 348/143, 148
See application file for complete search history.

(56) References Cited

U.S. PATENT DOCUMENTS

| 2007/0096236 A1 | 5/2007 | Yagyu et al. |
| 2008/0142714 A1 | 6/2008 | Nagai et al. |
| 2010/0051905 A1 | 3/2010 | Iguchi et al. |

FOREIGN PATENT DOCUMENTS

| JP | 63-01079 | 1/1988 |
| JP | 03-38887 | 2/1991 |

(Continued)

OTHER PUBLICATIONS

Yamamoto et al., "Optical properties of $GaAs_{0.5}Sb_{0.5}$ and $In_{0.53}Ga_{0.47}As/GaAs_{0.5}Sb_{0.5}$ type II single hetero-structures lattice-matched to InP substrates grown by molecular beam epitaxy," J. of Crystal Growth, Elsevier 201/202, pp. 872-876 (1999).

Sidhu et al., "A Long-Wavelength Photodiode on InP Using Lattice Matched GaInAs—GaAsSb Type-II Quantum Wells," IEEE Photonics Tech. Letters 17(12):2715-2717 (2005).

(Continued)

*Primary Examiner* — Allen Wong
(74) *Attorney, Agent, or Firm* — Fish & Richardson P.C.

(57) ABSTRACT

An image pickup device, a visibility support apparatus, a night vision device, a navigation support apparatus, and a monitoring device are provided in which noise and dark current are suppressed to thereby provide clear images regardless of whether it is day or night. The device includes a light-receiving layer 3 having a multi-quantum well structure and a diffusion concentration distribution control layer 4 disposed on the light-receiving layer so as to be opposite an InP substrate 1, wherein the light-receiving layer has a band gap wavelength of 1.65 to 3 μm, the diffusion concentration distribution control layer has a lower band gap energy than InP, a pn junction is formed for each light-receiving element by selective diffusion of an impurity element, and the impurity selectively diffused in the light-receiving layer has a concentration of $5\times10^{16}/cm^3$ or less. A diffusion concentration distribution control layer has an n-type impurity concentration of $2\times10^{15}/cm^3$ or less before the diffusion, the diffusion concentration distribution control layer having a portion adjacent to the light-receiving layer, the portion having a low impurity concentration. The concentration of the impurity element selectively diffused in the diffusion concentration distribution control layer is decreased to be $5\times10^{16}/cm^3$ or less toward the light-receiving layer.

17 Claims, 17 Drawing Sheets

(56) References Cited

FOREIGN PATENT DOCUMENTS

| | | |
|---|---|---|
| JP | 05-160426 | 6/1993 |
| JP | 05-160429 | 6/1993 |
| JP | 07-302928 | 11/1995 |
| JP | 09-037147 | 2/1997 |
| JP | 09-219563 | 8/1997 |
| JP | 2001-144278 | 5/2001 |
| JP | 2002-274258 | 9/2002 |
| JP | 2004-350228 | 12/2004 |
| JP | 2006-270060 | 10/2006 |
| JP | 2007-80920 | 3/2007 |
| JP | 2007-201432 | 8/2007 |
| JP | 2007-324572 | 12/2007 |
| JP | 2008-153311 | 7/2008 |
| JP | 2008-171885 | 7/2008 |
| JP | 2008-205001 | 9/2008 |
| JP | 2008-270760 | 11/2008 |
| JP | 2008-288293 | 11/2008 |
| WO | 2007/120931 | 10/2007 |

OTHER PUBLICATIONS

Murakami et al., "$In_XGa_{1-X}As/InAs_YP_{1-Y}$ detector for near infrared (1.2.6 μ m)," Conference Proceedings of Indium Phosphide and Related Materials, pp. 528-531 (1995).

Vatsia, M.L., "Atmospheric Optical Environment", Research and Development Tech. Report ECOM-7203, 123 pages, (Sep. 1972).

Cohen et al., "Near-IR imaging cameras operate at room temperature", Laser Focus World, pp. 109-113, (Jun. 1993).

Morita et al., Metalorganic vapor phase epitaxy growth of InGaAsP muti-quantum well laser diodes using entirely organic sources, Journal of Crystal Growth, 145(1-4):886-891 (1994).

Plis et al., "Midwave infrared type-II InAs/GaSb superlattice detectors with mixed interfaces", Journal of Applied Physics, 100(1), 014510, (2006).

Seltzer et al., Reliable 1.5 mu m buried heterostructure, separate confinement, multiple quantum well (BH-SC-MQW) lasers entirely grown by metalorganic vapour-phase epitaxy (MOVPE), IEEE Electronics Letters 25(21): 1449-1451 (1989).

Decision to Grant a Patent for Japanese Patent Application No. 2011-011131 (dated Feb. 9, 2011), with English translation.

International Search Report for PCT/JP2009/063246, Aug. 18, 2009.

(Note: SWIR cosmic light on arbitrary scale)

IMAGE PICKUP DEVICE, VISIBILITY SUPPORT APPARATUS, NIGHT VISION DEVICE, NAVIGATION SUPPORT APPARATUS, AND MONITORING DEVICE

CROSS-REFERENCE TO RELATED APPLICATION(S)

This application is a continuation of U.S. patent application Ser. No. 13/063,444, filed on Mar. 10, 2011, which is a national phase of PCT/JP2009/063246, filed on Jul. 24, 2009, the contents of which are incorporated by reference herein.

TECHNICAL FIELD

The present invention relates to an image pickup device, a visibility support apparatus, a night vision device, a navigation support apparatus, and a monitoring device that have a light-receiving sensitivity in the near-infrared wavelength range.

BACKGROUND ART (I) Cosmic light: Various electromagnetic waves (light) reach the ground from outer space. For example, radio astronomy in which the nature of outer space is studied by observing X rays from outer space is well known. Of electromagnetic waves that reach the ground from outer space, the short wavelength infrared (SWIR) band can be detected without large-scale apparatuses and hence has been attracting attention and often discussed in recent years. For example, observation results of SWIR spectra from outer space have been described and it has been discussed that the spectra have peaks in the range of 1.4 to 1.9 μm (Non Patent Document 1). In addition, for example, a night-vision camera including InGaAs light-receiving elements (In atom:Ga atom=0.53:0.47) whose lattice matches that of InP has been described (Non Patent Document 2). In this case, to make the lattice constant match that of an InP substrate, the atomic ratio of In/Ga is made to be 0.53/0.47. As a result, the long-wavelength limit (sensitivity limit) of the light-receiving elements is about 1.7 μm. In the descriptions below, light in the SWIR band that reaches the ground from outer space is referred to as cosmic light, SWIR cosmic light, or, simply, SWIR-band light.

(II) Compound semiconductor light-receiving element: A prototype of a light-receiving element has been announced in which the light-receiving sensitivity range is attempted to be increased to a longer wavelength by using a light-receiving layer of $In_{0.82}Ga_{0.18}As$ in which the Ga content is decreased and the In content is increased in terms of group III and, as a result, the band gap has been narrowed (lattice constant has been increased) (Non Patent Document 3). In such a case where the In content is increased, the lattice constant of InGaAs is increased and the lattice mismatch between InGaAs and an InP substrate is increased. In the above described light-receiving element, this problem was attempted to be solved by disposing 12 to 20 InAsP graded layers in which an (As/P) ratio is increased stepwise to the light-receiving layer between the InP substrate and the high-In-content InGaAs light-receiving layer. An increase in lattice mismatch results in an increase in the density of lattice defects, which inevitably increases dark current. Even when the graded buffer layers are provided, the dark current is 20 to 35 μA. This high dark current is three orders of magnitude higher than that of photodiodes with InGaAs light-receiving layers for optical communications. In addition, epitaxial growth of a large number of graded layers is not easy and increases the production cost.

In addition, a quaternary group III-V semiconductor has been proposed in which GaInNAs is used by further adding nitrogen (N) as another group V element to InGaAs and a decrease in the band gap has been achieved by the presence of N (Patent Document 1). However, it is very difficult to perform the technique of growing GaInNAs crystals, which contain N. In particular, to achieve a light-receiving sensitivity up to a wavelength of 3 μm and to achieve the lattice match with an InP substrate, the amount of nitrogen needs to be increased to about 10% (atomic % in group V elements). However, when the amount of nitrogen is made to be about 10%, it is very difficult to achieve good crystal quality. In addition, to achieve a high sensitivity of a light-receiving element, the thickness of the GaInNAs layer containing nitrogen at a high concentration needs to be 2 μm or more. However, it is more difficult to grow a N-containing crystal layer having such a thickness and good crystal quality.

The fabrication result of a photodiode with a cutoff wavelength of 2.39 μm has been reported in which a type II quantum well structure of InGaAs/GaAsSb is used and a pn junction is formed with a p-type or n-type epitaxial layer (Non Patent Document 4). This document states that, to make the cutoff wavelength longer, distortion compensation is necessary, and proposes a photodetector having a distortion-compensation quantum well structure of Ga(In)AsSb/GaInAs(Sb) and a cutoff wavelength of 2 to 5 μm.

An image pickup device has an array structure in which a plurality of light-receiving elements are two-dimensionally or one-dimensionally arranged. However, unless the light-receiving elements are isolated from each other with certainty, dark current, crosstalk, or the like is caused and clear images are not provided. It is necessary that photodiodes include a pn junction. In the above-described photodiode, the pn junction is formed by, on a p-type semiconductor layer or an n-type semiconductor layer, epitaxially growing an opposite conduction-type semiconductor layer with each other. In this case, to divide a wide and planar pn junction into pn junctions for individual light-receiving elements, trenches for the division into individual light-receiving elements are provided. Such trenches are referred to as element isolation trenches and are formed by mesa etching after the formation of a planar pn junction. In the formation of element isolation trenches in a near-infrared photodiode including an InP substrate, an etchant having selectivity between InP and InGaAs is used. As a result, wet etching can be stopped at the boundary between the layers (Patent Document 2).

However, when such a wet etching process is used, it is difficult to accurately control the shape of light-receiving elements to be provided by the division. For example, light-receiving elements whose longitudinal sections are tapered and have a shape of trapezoid are formed, light-receiving elements in which the side surfaces of laminated bodies have indentations (irregularities) according to semiconductor layers are formed, or light-receiving elements are formed in which an etchant does not sequentially reach regions between light-receiving elements and the formation of complete trenches is not achieved but is stopped midway. It is very difficult to completely eliminate such imperfection of element isolation trenches. Alternatively, when a dry etching process is used, damage is caused during the etching and hence it is difficult to stably produce photodiodes having low dark current. Thus, the yield is degraded and the production cost is increased.

As for the formation of a structure in which a plurality of light-receiving elements are arranged, that is, the formation of an array of light-receiving elements, in the structures proposed in the above-described documents, the pn junctions except for that in Non Patent Document 3 are formed between a p-type epitaxial layer and an n-type epitaxial layer and a one-dimensional or two-dimensional arrangement of light-receiving elements is formed with element isolation trenches. Accordingly, the above-described problem (high dark current) due to the formation of element isolation trenches is caused.

(III) Night vision device: In recent years, night vision devices employing light in the near-infrared long-wavelength range have been proposed. For example, those proposed are an apparatus that enhances the rear vision of an automobile by radiating infrared rays to subjects including human beings and capturing the reflected light with an infrared camera (Patent Document 3); similarly, a night vision device for automobiles in which near-infrared light-emitting diodes (LEDs) and an image pickup device are combined (Patent Document 4); a vision apparatus employing the combination of two wavelength ranges in the infrared region and the near-infrared region (Patent Document 5); an image pickup device mounted on a vehicle in which light in the 1.5 μm band is received with InGaAs light-receiving elements (Patent Document 6); and the like.

[Non Patent Document 1] Vatsia, Mirshri, L. "Atmospheric Optical Environment", Research and Development Technical Report ECOM-7023, September (1972)

[Non Patent Document 2] Marshall J. Cohen, "Near-IR imaging cameras operate at room temperature", LASER FOCUS WORLD June 1993 p. 109 (Sensors Unlimited)

[Non Patent Document 3] T. Murakami, H. Takahashi, M. Nakayama, Y. Miura, K. Takemoto, D. Hara, "InxGa1-xAs/InAsyP1-y detector for near infrared (1-2.6 μm)", Conference Proceedings of Indium Phosphide and Related Materials 1995, May, Sapporo, pp. 528-531

[Non Patent Document 4] R. Sidhu, "A Long-Wavelength Photodiode on InP Using Lattice-Matched GaInAs-GaAsSb Type-II Quantum Wells, IEEE Photonics Technology Letters, Vol. 17, No. 12 (2005), pp. 2715-2717

[Patent Document 1] Japanese Unexamined Patent Application Publication No. 9-219563

[Patent Document 2] Japanese Unexamined Patent Application Publication No. 2001-144278

[Patent Document 3] Japanese Unexamined Patent Application Publication No. 2004-350228

[Patent Document 4] Japanese Unexamined Patent Application Publication No. 2002-274258

[Patent Document 5] Japanese Unexamined Patent Application Publication No. 9-37147

[Patent Document 6] Japanese Unexamined Patent Application Publication No. 7-302928

DISCLOSURE OF INVENTION

Problems to be Solved by the Invention

The above-described problems in existing techniques are summarized as follows.

(A1) Compound semiconductor light-receiving element array: Noise and dark current are high and there are many black dots (missing dots in images) and hence clear images are not provided. As the temperature rises, in particular, the clarity of images is considerably degraded.

(A2) Night vision device: A source of light such as infrared rays or near-infrared rays is necessary. In addition, the device is complex, which incurs high cost. The clarity of images is insufficient.

An object of the present invention is to provide an image pickup device or the like that can overcome the above-described problems by forming a light-receiving layer that can receive light in a range covering longer wavelengths with a compound semiconductor having good crystal quality. Specifically, an object of the present invention is to provide an image pickup device including a light-receiving layer with which noise and dark current are suppressed and clear images are provided with certainty regardless of whether it is day or night; and a visibility support apparatus, a night vision device, a navigation support apparatus, and a monitoring device that include such an image pickup device.

Here, these apparatuses are roughly classified as follows: the visibility support apparatus is an apparatus that is mounted on a vehicle (automobile or the like) and configured to enhance the vision of the driver for the purpose of enhancing safety; the night vision device is a device that a person can carry; the navigation support apparatus is an apparatus that is mounted on a ship and configured to enhance recognition of targets in a certain manner; and the monitoring device is a device installed at a stationary point and configured to monitor surveillance subjects. However, such a classification is not strictly defined.

Means for Solving the Problems

An image pickup device according to the present invention includes a two-dimensional array of pixels that are semiconductor light-receiving elements made of group III-V semiconductors formed on an InP substrate. The image pickup device is configured to capture an image of an object by receiving light in a near-infrared region reflected by the object. In the image pickup device, each of the semiconductor light-receiving elements includes a light-receiving layer that is formed on the InP substrate and has a multi-quantum well structure composed of group III-V semiconductors; and a diffusion concentration distribution control layer made of group III-V semiconductors disposed in contact with the light-receiving layer on a side of the light-receiving layer opposite the side adjacent to the InP substrate. The light-receiving layer has a band gap wavelength of 1.65 to 3 μm. The diffusion concentration distribution control layer has a lower band gap energy than InP. A pn junction is formed for each of the pixels by selective diffusion of an impurity element, and the impurity in the light-receiving layer has a concentration of $5 \times 10^{16}/cm^3$ or less, the diffusion concentration distribution control layer has an n-type impurity concentration of $2 \times 10^{15}/cm^3$ or less before the diffusion, the diffusion concentration distribution control layer having a portion adjacent to the absorption layer, the portion having a low impurity concentration. The concentration of the impurity element selectively diffused in the diffusion concentration distribution control layer is decreased to be $5 \times 10^{16}/cm^3$ or less toward the light-receiving layer.

According to such a configuration in which the concentration of the impurity is made a low value of 5E16 $cm^{-3}$ or less, a multi-quantum well structure having a band gap energy corresponding to the near-infrared region can be formed without degrading crystal quality. The impurity for forming the pn junctions of the light-receiving elements is selectively diffused, that is, introduced within the periphery of each light-receiving element and within a restricted region in plane, in an isolated form for each light-receiving element. Accordingly, the light-receiving elements are readily formed with a high accuracy and the necessity of forming element isolation trenches has been eliminated. Thus, a light-receiving element array in which dark current is low and crosstalk is suppressed can be formed.

In addition, according to the above-described configuration, an image of an object can be captured by receiving light that is cosmic light having a peak in the wavelength range of 1.4 to 1.9 μm and having been reflected by the object. Thus, clear images can be provided regardless of whether it is day or night. Since semiconductor light-receiving elements having a sensitivity in the range of 3.0 μm or less can reduce the influence of an absorption peak (there is a broad absorption in the wavelength range of more than 3.0 μm) in the medium wavelength infrared (MWIR) region in the absorption spectrum of water, clear images can be provided even in an environment containing fog, smoke, or dust.

Furthermore, since images can be captured without performing auxiliary light radiation, the possibility that radiated light is incident on and damages human eyes can be completely eliminated. Herein, the band gap wavelength is calculated by converting band gap energy into optical wavelength and satisfies the following relationship: Band gap wavelength (μm)=1.2398/band gap energy (eV). Note that the band gap wavelength of 1.65 to 3.0 μm of the multi-quantum well structure encompasses subbands.

Note that the above-described pn junction should be broadly understood as follows: the pn junction encompasses a junction formed between, in the light-receiving layer, an impurity region in which the impurity is introduced by selective diffusion and a region that is in a side opposite the side in which the impurity element is introduced by selective diffusion and that has so low an impurity concentration (referred to as an i-region) that the region can be regarded as an intrinsic semiconductor. That is, the above-described pn junction may be a pi junction, an ni junction, or the like. Furthermore, the above-described pn junction encompasses a pi junction in which the p concentration is very low and an ni junction in which the n concentration is very low.

In addition, the band gap energy of the diffusion concentration distribution control layer can be made lower than that of the InP substrate. As a result, even when the impurity concentration of some region of the diffusion concentration distribution control layer close to the light-receiving layer is made low, since the band gap energy is low, the electrical resistance can be made not higher than that in the case of using a material having the band gap energy of InP.

The reasons for making the band gap energy of the diffusion concentration distribution control layer be lower than that of the InP substrate are as follows.

(1) When a light-receiving layer for the near-infrared region is formed of group III-V compound semiconductors, there are cases where a window layer is formed of a material having a band gap energy higher than that of the light-receiving layer. In such cases, in consideration of lattice matching and the like, the material is often the same material as in the semiconductor substrate. The band gap energy corresponding to the cutoff wavelength in the near-infrared region is 0.7 to 0.8 eV. The band gap energy of the diffusion concentration distribution control layer is lower than that of the window layer and considerably higher than that of the light-receiving layer, which is a prerequisite. This is because, when the band gap energy of the diffusion concentration distribution control layer overlaps with or is too close to that of the light-receiving layer, in the case of employing a structure in which the surface of the epitaxial layer serves as an incident surface, the diffusion concentration distribution control layer absorbs light that should be absorbed by the light-receiving layer and the light-receiving sensitivity of the light-receiving layer is degraded.

(2) By using a material having a band gap energy lower than that of materials with high band gap energy that are generally used to form the window layer, even when the impurity concentration is made low, the degree of an increase in the electrical resistance and the degree of a decrease in the electrical conductivity can be suppressed. As a result, as described above, a decrease in the response speed under the application of a voltage can be suppressed.

The diffusion concentration distribution control layer has a first region located adjacent to a surface of the diffusion concentration distribution control layer opposite the surface in contact with the absorption layer, the concentration of the impurity element in the first region being about $1 \times 10^{18}/cm^3$ or more, a second region located adjacent to the absorption layer, the concentration of the impurity element in the second region being $2 \times 10^{16}/cm^3$ or less, and a third region located between the first region and the second region, the third region having a smaller thickness than those of the first and second regions, and the concentration of the impurity element in the third region being more than $2 \times 10^{16}/cm^3$ and less than $1 \times 10^{18}/cm^3$. The concentration of the impurity element in the region located adjacent to a surface of the diffusion concentration distribution control layer opposite the surface in contact with the light-receiving layer being $1 \times 10^{18}/cm^3$ or more. As a result, while the interface resistance of an electrode disposed on the top surface is suppressed or an ohmic contact of the electrode is achieved, good crystal quality of the multi-quantum well structure can be ensured. As described above, the problem of an increase in the electrical resistance or a decrease in the electrical conductivity due to a low impurity concentration in a portion of the diffusion concentration distribution control layer can be suppressed with the band gap energy lower than the band gap energy equivalent to that of InP.

The multi-quantum well structure can be made of a type II GaAsSb/InGaAs multi-quantum well structure or a type II GaAsSb/InGaAsN(P,Sb) multi-quantum well structure. As a result, light-receiving elements that have excellent crystal quality, a low dark current, and a sensitivity in a long wavelength range of the SWIR band can be readily provided with materials and expertise having been accumulated.

The impurity element may be zinc (Zn) and the diffusion concentration distribution control layer may be composed of InGaAs. As a result, the diffusion concentration distribution control layer can be formed of a material that has a low dependence of the electrical resistance on impurity concentration, the material not having very high electrical resistance even in the case of a low impurity concentration. The selective diffusion of zinc serving as an impurity has been performed many times in practical production and the concentration distribution of zinc can be formed with a high accuracy. Accordingly, the diffusion concentration distribution control layer can be made such that, while the impurity has a high concentration in an upper region through which the impurity is introduced to diffuse and the impurity has a low concentration in a lower region close to the light-receiving layer, an increase in the electrical resistance in the lower region is suppressed. As a result, the light-receiving layer having a quantum well structure can be made so as not to have a region in which the impurity concentration is high. Thus, a light-receiving element array having a quantum well structure with good crystal quality can be provided without degrading responsivity. Note that InGaAs has a band gap energy of 0.75 eV.

The InP substrate is preferably an off-angle substrate that is inclined by 5° to 20° in [111] direction or [11-1] direction with respect to (100). Thus, a laminated body including a light-receiving layer having a multi-quantum well structure with a low defect density and excellent crystal quality can be provided. As a result, a light-receiving layer in which dark current is suppressed and the number of black dots is small can be provided.

Two parts freely selected from the InP substrate, layers constituting the quantum well structure of the light-receiving layer, and the diffusion concentration distribution control layer can be made to satisfy a lattice matching degree (|Δa/a|, where a represents a lattice constant and Δa represents a difference between lattice constants of the two parts) of 0.002 or less. In such a configuration, a light-receiving layer having excellent crystal quality can be provided with an InP substrate that is commonly available.

The image pickup device may be configured to receive light in a wavelength range of 1.0 to 3.0 μm. Accordingly, as described above, since light-receiving elements having a sensitivity in the range of 1.0 μm or more and 3.0 μm or less can reduce the influence of an absorption peak (there is a broad absorption in the wavelength range of more than 3.0 μm) in the medium wavelength infrared (MWIR) region in the absorption spectrum of water, clear images can be provided even in an environment containing fog, smoke, or dust. Furthermore, since images can be captured without performing auxiliary light radiation, the possibility that radiated light is incident on and damages human eyes can be completely eliminated. Note that the term "to receive light in a wavelength range of 1.0 to 3.0 μm" denotes that, as described above, having no sensitivity in wavelength ranges other than the wavelength range of 1.0 to 3.0 μm. This may be achieved in the cases where the sensitivity is restricted within the wavelength range of 1.0 to 3.0 μm due to characteristics of compound semiconductors forming the light-receiving layer. In such cases, the long-wavelength limit of the sensitivity may be 2.0 μm or 2.5 μm. In particular, to achieve a long-wavelength (short-wavelength) limit of 3.0 μm (1.0 μm), a filter that cuts off light having a wavelength of more than 3.0 μm (light having a wavelength of less than 1.0 μm) may be provided.

The light-receiving elements may be configured to receive light in a wavelength range of 1.0 to 2.0 μm. In such a configuration, since reflected light of cosmic light having a peak in the wavelength range of 1.4 to 1.9 μm can be exclusively received, image disturbance due to the absorption spectrum of water or the like can be further reduced with certainty. Specifically, as described above, the absorption spectrum of water has absorptions in the short wavelength range and in the long wavelength range (particularly a broad absorption in the long wavelength range) with respect to the wavelength of 3.0 μm. Accordingly, as described above, by receiving light in a wavelength range of 1.0 to 2.0 μm, the influence of the maximum peak in the neighborhood of 3.0 μm in the absorption spectrum of water is eliminated and image disturbance due to the absorption spectrum of water can be suppressed. As in the above-described case, the term "to receive light in a wavelength range of 1.0 to 2.0 μm" denotes that having no sensitivity in wavelength ranges other than the wavelength range of 1.0 to 2.0 μm. This may be achieved in the cases where the sensitivity is restricted within the wavelength range of 1.0 to 2.0 μm due to characteristics of compound semiconductors forming the light-receiving layer. In such cases, the long-wavelength limit of the sensitivity may be 1.5 μm or 1.75 μm. In particular, to achieve a long-wavelength (short-wavelength) limit of 2.0 μm (1.0 μm), a filter that cuts off light having a wavelength of more than 2.0 μm (light having a wavelength of less than 1.0 μm) may be provided.

A visibility support apparatus according to the present invention includes any one of the above-described image pickup devices. In such a configuration, dark current is suppressed and images having a small number of black dots can be provided to thereby raise the level of vision enhancement. For example, an existing visibility support apparatus for vehicles radiates infrared light or near-infrared light to an object and receives the reflected light to thereby capture images of the object. However, according to the above-described configuration, since cosmic light in the SWIR band is utilized, radiation means is not necessary and visibility support apparatuses can be simplified to thereby reduce the production cost. This leads to reduction in in-vehicle mounting space and cost, which is an important factor in promoting the widespread use of such apparatuses. In addition, the problem relating to in-vehicle mounting space and production cost in the system of combining the detection of infrared light and the detection of near-infrared light can also be avoided.

In addition, since no light is radiated, damage caused by radiation to human eyes can be avoided and no mechanism or system for avoiding light is necessary. This advantage of a visibility support apparatus according to the present invention is particularly valuable for a vehicle visibility support apparatus that is mainly used for detecting people for the purpose of preventing accidents involving human injury or death.

In addition, an apparatus receiving SWIR cosmic light according to the present invention can appropriately avoid (i) the problem that, in the case of receiving infrared light, images are extremely unclear due to absorption by moisture such as fog and (ii) the problem that, in the case of receiving heat radiation from objects and living things, non-living things having small temperature difference from the environment temperature, people wearing outfits for cold weather, and the like are less likely to be detected. Such an advantage is also valuable for a vehicle visibility support apparatus with which ensuring safe driving is of importance regardless of driving environments.

An apparatus used for enhancing vision from a vehicle includes image capturing means for capturing a forward vision image or a rear vision image of the vehicle and display means for displaying the image captured by the image capturing means, wherein any one of the above-described image pickup devices is used as the image capturing means.

According to such a configuration, this visibility support apparatus is mounted on a vehicle and the driver can drive the vehicle at night while having clearer forward or rear vision and clearer recognition of obstacles.

The apparatus may further include control means for driving and controlling the image capturing means and/or the display means. As a result, images that are more readily recognized by the driver can be captured.

A night vision device according to the present invention is an optical device allowing visualization of an object at night, the night vision device including any one of the above-described image pickup devices. As a result, light in the near-infrared region to the infrared region such as night glow reflected by objects can be received with a high sensitivity without using a radiation device and clear night-vision images can be obtained with the device having a simple configuration. Accordingly, the device is easy to carry and the eye-safety problem due to infrared radiation can be avoided.

A navigation support apparatus according to the present invention is mounted on a ship, the navigation support apparatus including an optical device for recognizing a target such as another ship, wherein any one of the above-described image pickup devices is used as the optical device. According to such a configuration, targets that have a small temperature difference from the environment temperature and are less likely to be clearly shot with infrared cameras can be recognized with certainty under any weather condition regardless of whether it is day or night.

A monitoring device according to the present invention is disposed at a stationary point, the monitoring device including an optical device for monitoring a surveillance subject, wherein any one of the above-described image pickup devices is used as the optical device. As a result, the surveillance subject can be acquired with certainty without installing, in the monitoring device, a light source for radiating light to the surveillance subject. Herein, such a monitoring device encompasses a monitoring device that monitors a platform and the corresponding railway track for the purpose of avoiding train accidents; a monitoring device that is attached to a door phone or the like and captures images of visitors; a monitoring device that monitors persons to determine whether the persons are intruders or not; and the like; and, furthermore, an indoor monitoring device that monitors indoors for the purpose of monitoring a person requiring care or the like and sends images to a care center or the like; a monitoring device that detects a fire and locates the site of the fire for the purpose of urban prevention; a remote monitoring device that remotely monitors change in the position of a part or the like and outputs an alarm state of a large-scale apparatus such as a dam; and the like.

The above-described visibility support apparatus, night vision device, navigation support apparatus, or monitoring device may have a configuration that does not include means for radiating infrared light, near-infrared light, or visible light. As a result, in-vehicle mounting space, the space within such an apparatus, installation space, or the like can be reduced and cost can be reduced.

The above-described visibility support apparatus, night vision device, navigation support apparatus, or monitoring device may have a configuration that does not include means for radiating light having a wavelength range of 1.4 µm or less. As a result, the radiation of light having a wavelength range of 1.4 µm or less, which particularly adversely affects human eyes, is eliminated and the system for preventing the radiation of the light to human eyes is no longer necessary.

Advantages

The present invention can provide an image pickup device, a visibility support apparatus, a night vision device, a navigation support apparatus, or a monitoring device, each of which can provide clear images regardless of whether it is day or night and regardless of weather condition.

BEST MODES FOR CARRYING OUT THE INVENTION

First Embodiment

Structure of Semiconductor Light-Receiving Element Array

Figure 1:
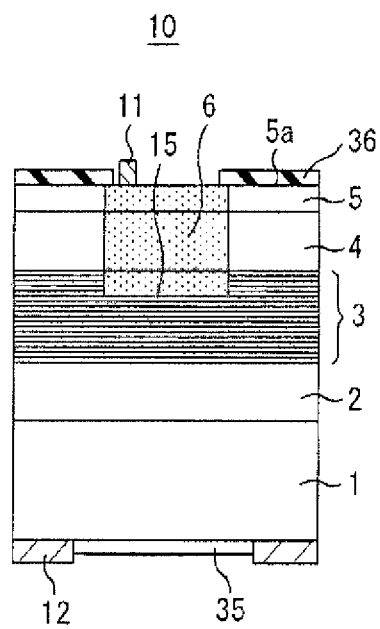
FIG. 1 is a sectional view illustrating a light-receiving element according to a first embodiment of the present invention.

FIG. 1 is a sectional view illustrating a light-receiving element 10 according to an embodiment of the present invention. In FIG. 1, the light-receiving element 10 includes a group III-V semiconductor laminate structure (epitaxial wafer) having the following configuration.
(InP substrate 1/InP buffer layer 2/light-receiving layer 3 having a multi-quantum well structure composed of InGaAs or GaInNAs and GaAsSb/InGaAs diffusion concentration distribution control layer 4/InP window layer 5)

A p-type region 6 is disposed so as to extend from the InP window layer 5 to the light-receiving layer 3 having a multi-quantum well structure. The p-type region 6 is formed by selectively diffusing Zn, which is a p-type impurity, through an opening of a selective diffusion mask pattern 36 of a SiN film. This diffusive introduction of Zn, which is a p-type impurity, within the periphery of the light-receiving element 10 and within a restricted region in plane is achieved by diffusing Zn through the selective diffusion mask pattern 36 of the SiN film.

A p-side electrode 11 composed of AuZn is provided on the p-type region 6 so as to be in ohmic contact with the p-type region 6. An n-side electrode 12 composed of AuGeNi is provided on the back surface of the InP substrate 1 so as to be in ohmic contact with the InP substrate 1. In this case, the InP substrate 1 is doped with an n-type impurity such that conductivity at a predetermined level is achieved. An anti-reflection film 35 composed of SiON is also provided on the back surface of the InP substrate 1 so that reflection from the back surface is suppressed when the front surface of the epitaxial layers serves as an incident surface, to thereby suppressing crosstalk or the like.

Figure 2:
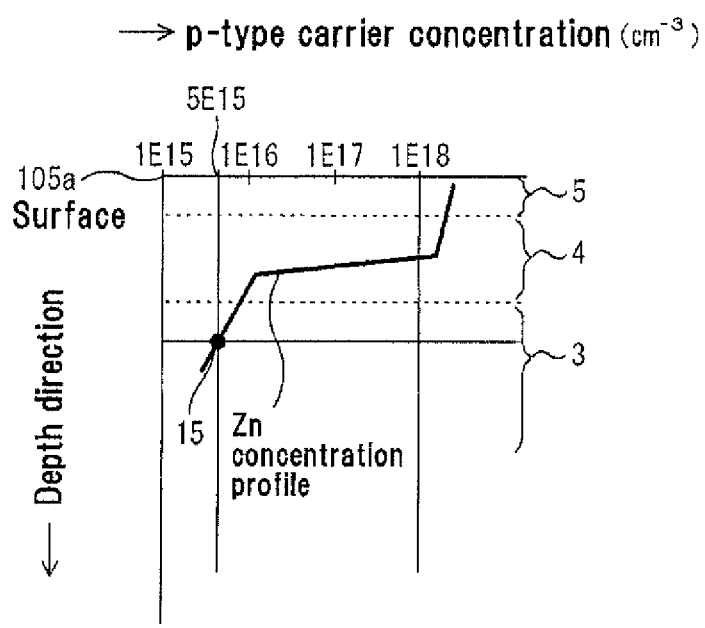
FIG. 2 illustrates a Zn concentration distribution in the light-receiving element in FIG. 1.

In the light-receiving layer 3 having a multi-quantum well structure, a pn junction is formed at a position corresponding to the front of the p-type region 6. By applying a reverse bias voltage between the p-side electrode 11 and the n-side electrode 12, a depletion layer having a larger width on a side of the pn junction is formed, the side having a lower n-type impurity concentration (n-type impurity background). The background of the light-receiving layer 3 having a multi-quantum well structure is about 5E15 cm$^{-3}$ or less in terms of n-type impurity concentration (carrier concentration). The position of a pn junction 15 is determined to be the point of intersection of the background (n-type carrier concentration) of the light-receiving layer 3 having a multi-quantum well and the concentration profile of Zn, which is a p-type impurity. Specifically, the position is illustrated in FIG. 2.

In the diffusion concentration distribution control layer 4, the concentration of a p-type impurity selectively diffused from a surface 5a of the InP window layer 5 sharply drops from a high-concentration region that is close to the InP window layer 5 to the light-receiving layer 3. Accordingly, a Zn concentration (impurity concentration) of 5E16 cm$^{-3}$ or less can be readily achieved in the light-receiving layer 3. In FIG. 2, a Zn concentration of about 1E16 cm$^{-3}$ or less, which is lower, is achieved in the light-receiving layer 3.

The light-receiving element 10 according to the present invention is intended to have a light-receiving sensitivity ranging from the near-infrared region to a longer wavelength region. Accordingly, the window layer 5 is preferably composed of a material having a band gap energy higher than that of the light-receiving layer 3. Thus, the window layer 5 is generally composed of InP, which has a higher band gap energy than the light-receiving layer 3 and provides good lattice matching. Alternatively, InAlAs, which has substantially the same band gap energy as InP, may be used.

Figure 3:
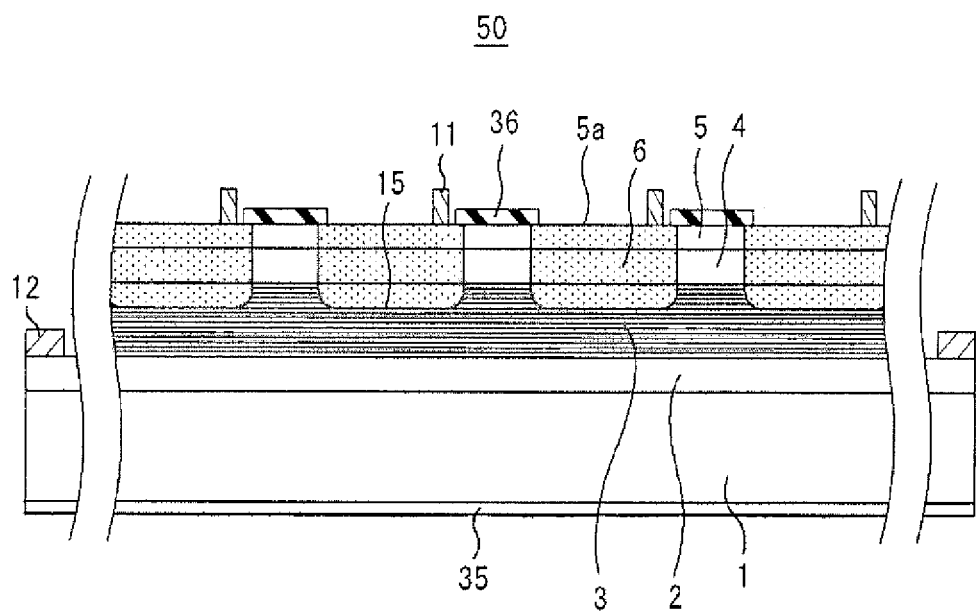
FIG. 3 is a sectional view illustrating a light-receiving element array according to the first embodiment of the present invention.

FIG. 3 is a sectional view illustrating a light-receiving element array 50 in which a plurality of the light-receiving elements 10 are arranged on an epitaxial wafer including the common InP substrate 1. The light-receiving element array 50 has a feature that the plurality of light-receiving elements 10 are arranged without element isolation trenches. As described above, each p-type region 6 is restricted within each light-receiving element and is isolated with certainty from neighboring light-receiving elements. The light-receiving element array 50 is the same as the light-receiving element 10 in FIG. 1 in that, for example, the light-receiving layer 3 is formed so as to have a multi-quantum well structure, the diffusion concentration distribution control layer 4 is disposed on the light-receiving layer 3, and the p-type impurity concentration of the light-receiving layer 3 is made 5E16 cm$^{-3}$ or less.
(Points of the Semiconductor Light-Receiving Element Array)

The features of the first embodiment are as follows.
1. When an impurity is introduced by selective diffusion at a high concentration into a multi-quantum well structure, the structure is destroyed. Accordingly, the amount of an impurity introduced by selective diffusion needs to be low. In general, the concentration of such a p-type impurity introduced by diffusion needs to be made 5×10$^{16}$/cm$^3$ or less.
2. To achieve the above-described low concentration of a p-type impurity in practical production with high reproducibility and stability, the diffusion concentration distribution control layer 4 composed of InGaAs is disposed on the light-receiving layer 3. In the diffusion concentration distribution control layer 4, when a thickness region close to the light-receiving layer 3 has the above-described low impurity concentration, in this region having the low impurity concentration, the electrical conductivity is decreased and the electrical resistance is increased. When the electrical conductivity of the region having the low impurity concentration in the diffusion concentration distribution control layer 4 is decreased, responsivity is degraded and, for example, good moving images are not provided. However, when the diffusion concentration distribution control layer 4 is formed of a material having a band gap energy smaller than the band gap energy equivalent to that of InP, specifically, a group III-V semiconductor material having a band gap energy of less than 1.34 eV, even when the impurity concentration is low, the diffusion concentration distribution control layer 4 is not used at absolute zero and hence the electrical conductivity is not decreased considerably. Examples of such a group III-V semiconductor material that satisfies the requirement of the diffusion concentration distribution control layer include InGaAs and GaAs.

When the diffusion concentration distribution control layer is composed of a material having a low band gap energy, even when the impurity concentration is low, an increase in the electrical resistance can be suppressed. The speed of response to the application of a reverse bias voltage or the like is probably determined by the time constant CR relating to capacitance and electrical resistance. Accordingly, by suppressing an increase in the electrical resistance R as described above, the speed of response can be shortened.
3. In the first embodiment, the multi-quantum well structure is of type II. In a light-receiving element that has the type I quantum well structure where a semiconductor layer having a low band gap energy is sandwiched between semiconductor layers having a high band gap energy and that has a light-receiving sensitivity in the near-infrared region, the band gap of the semiconductor layer having a low band gap energy determines the upper wavelength limit of the light-receiving sensitivity (cutoff wavelength). That is, transition of electrons or holes due to light is caused within the semiconductor layer having a low band gap energy (direct transition). In this case, materials with which the cutoff wavelength can be increased to longer wavelengths are very restricted in group III-V compound semiconductors. In contrast, in the type II quantum well structure where two different semiconductor layers having a common Fermi energy are alternately stacked, the energy difference between the conduction band of the first semiconductor and the valence band of the second semiconductor determines the upper wavelength limit of the light-receiving sensitivity (cutoff wavelength). That is, transition of electrons or holes due to light is caused between the valence band of the second semiconductor and the conduction band of the first semiconductor (indirect transition). Thus, by making the energy of the valence band of the second semiconductor be higher than that of the valence band of the first semiconductor and making the energy of the conduction band of the first semiconductor be lower than that of the conduction band of the second semiconductor, the light-receiving sensitivity can be readily made to cover longer wavelengths, compared with the case of direct transition within a single semiconductor.

4. As described above, since a p-type impurity is diffusively introduced within the periphery of the light-receiving element and within a restricted region in plane by selective diffusion through the selective diffusion mask pattern 36, the pn junction is not exposed on end surfaces of the light-receiving element. As a result, leakage of photocurrent is suppressed. In addition, as is clear from the structure of the light-receiving element array 50 in FIG. 3, crosstalk is also suppressed.

Hereinafter, a method for producing the light-receiving element 10 illustrated in FIG. 1 will be described. The InP buffer layer 2 or InGaAs buffer layer 2 that has a thickness of 2 μm is formed on the n-type InP substrate 1. Then, the light-receiving layer 3 having a multi-quantum well structure of (InGaAs/GaAsSb) or (GaInNAs/GaAsSb) is formed. The GaInNAs layer or the GaAsSb layer that forms the unit quantum well structure has a thickness of 5 nm. The number of pairs (the number of the unit quantum well repeated) is 300. Subsequently, an InGaAs layer having a thickness of 1 μm that serves as the diffusion concentration distribution control layer 4 for Zn diffusive introduction is epitaxially grown on the light-receiving layer 3. Then, lastly, the InP window layer 5 having a thickness of 1 μm is epitaxially grown. Both the light-receiving layer 3 and the diffusion concentration distribution control layer 4 are preferably epitaxially grown by a molecular beam epitaxy (MBE) method. The InP window layer 5 may be epitaxially grown by the MBE method. Alternatively, after the diffusion concentration distribution control layer 4 is grown, the InP substrate 1 is taken out from the MBE apparatus and the InP window layer 5 may be epitaxially grown by a metal organic vapor phase epitaxy (MOVPE) method.

The InP buffer layer 2 or InGaAs buffer layer 2 may be non-doped or doped with an n-type dopant such as Si in a concentration of about $1E17\ cm^{-3}$. The light-receiving layer 3 having a multi-quantum well structure of (InGaAs/GaAsSb) or (GaInNAs/GaAsSb), the diffusion concentration distribution control layer 4 composed of InGaAs, and the InP window layer 5 are desirably non-doped, but may be doped with an n-type dopant such as Si in a very low concentration (for example, about $2E15\ cm^{-3}$). An n-side electrode-forming layer for forming an n-side electrode, that is doped with an n-type dopant in a high concentration of about $1E18\ cm^{-3}$ may be disposed between the InP substrate 1 and the buffer layer 2. The InP substrate 1 may be a Fe-doped semi-insulating InP substrate. In this case, the n-side electrode may be formed by disposing an n-side electrode-forming layer doped with an n-type dopant in a concentration of about $1E18\ cm^{-3}$ between the semi-insulating InP substrate 1 and the buffer layer 2.

An optical device is produced with the laminated structure (epitaxial wafer) including the InP substrate 1. Zn is selectively diffused through openings of the SiN mask pattern 36 formed on the surface 5a of the InP window layer 5 to thereby form the p-type region 6 such that the p-type region 6 extends into the light-receiving layer 3 having a multi-quantum well structure of (InGaAs/GaAsSb) or (GaInNAs/GaAsSb). The front portion of the p-type region 6 forms the pn junction 15. At this time, a high-concentration region having a Zn concentration of about $1E18\ cm^{-3}$ or more is restricted within the InGaAs diffusion concentration distribution control layer 4. Specifically, the impurity is continuously distributed in a high concentration from the surface 5a of the InP window layer 5 in the depth direction to a portion within the InGaAs diffusion concentration distribution control layer 4, and the concentration thereof decreases to $5E16\ cm^{-3}$ or less in a deeper portion of the diffusion concentration distribution control layer 4. The Zn concentration distribution in the neighborhood of the pn junction 15 represents a graded junction.

In the one-dimensional or two-dimensional arrangement of the light-receiving elements 10, that is, the light-receiving element array 50 illustrated in FIG. 3, neighboring light-receiving elements are isolated from each other by selective diffusion of Zn (diffusion within the periphery of a light-receiving element and within a restricted region in plane) without performing mesa etching for element isolation. Specifically, while the Zn selective-diffusion region 6 serves as the main portion of the light-receiving element 10 and forms a single pixel, regions in which Zn is not diffused isolate the pixels from each other. Accordingly, crystals are not suffered from damage or the like caused by mesa etching and dark current can be suppressed.

When a pn junction is formed by selective diffusion of an impurity, the diffusion proceeds not only in the depth direction but also in the transverse direction (direction that is perpendicular to the depth). Accordingly, Patent Document 2 describes a concern that the spacing between elements cannot be decreased to a certain value or less. However, as a result of actually conducting selective diffusion of Zn, it has been confirmed that, in a structure in which the InP window layer 5 is disposed in the uppermost surface and the InGaAs diffusion concentration distribution control layer 4 is disposed under the InP window layer 5, the diffusion in the transverse direction remains to a degree similar to or less than that in the depth direction. Specifically, in the selective diffusion of Zn, although Zn diffuses in the transverse direction beyond the diameter of the openings of the mask pattern 36, the degree of the diffusion in the transverse direction is small and, as schematically illustrated in FIGS. 1, 3, and the like, Zn diffuses only a little beyond the openings of the mask pattern 36.

Figure 4:
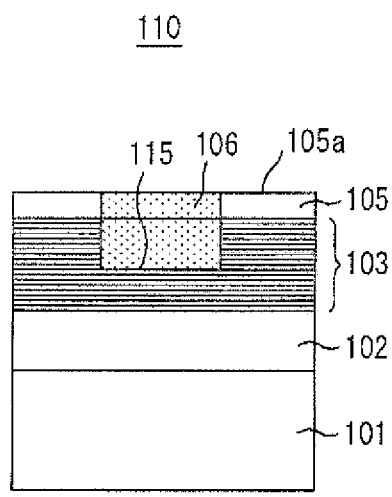
FIG. 4 is a sectional view illustrating a light-receiving element in Reference example 1, which is different from the present invention.

FIG. 4 is a sectional view illustrating a light-receiving element 110 in Reference example 1, which is different from the present invention. The light-receiving element 110 in Reference example 1 has the following laminated structure.

(InP substrate 101/InP or InGaAs buffer layer 102/light-receiving layer 103 having a multi-quantum well structure of (GaInNAs/GaAsSb)/InP window layer 105)

This is different from the laminated structure according to an embodiment of the present invention in that there is no diffusion concentration distribution control layer. Specifically, the light-receiving layer 103 having a multi-quantum well structure is disposed immediately below the InP window layer 105.

Figure 5:
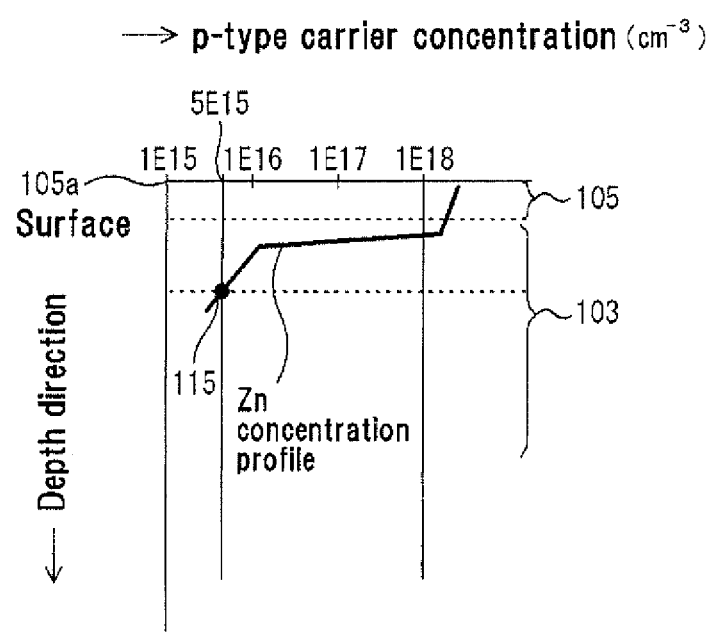
FIG. 5 illustrates a Zn concentration distribution in the light-receiving element in FIG. 4.

When the diffusion concentration distribution control layer is not provided, as illustrated in FIG. 5, for example, a Zn concentration distribution is formed such that a high concentration is maintained to the light-receiving layer 103 having a multi-quantum well structure. Specifically, in the multi-quantum well structure, a region in which the concentration of the impurity is a high value of 1E18 $cm^{-3}$, which is beyond 5E16 $cm^{-3}$, is formed. When an impurity is introduced into a multi-quantum well structure at a high concentration, the structure is destroyed and dark current considerably increases. In contrast, for the purpose of not forming such a high impurity concentration region in a multi-quantum well structure, a diffusion concentration distribution control layer is formed and an impurity is selectively diffused.

However, as for the selective diffusion of Zn, the following considerations may be made.

(1) The time for diffusive introduction is restricted to a short time such that the high-concentration region does not extend into the multi-quantum well structure 103.

(2) The thickness of the InP window layer 105 is increased and the InP window layer 105 is made to play the role of a diffusion concentration distribution control layer.

Figure 6:
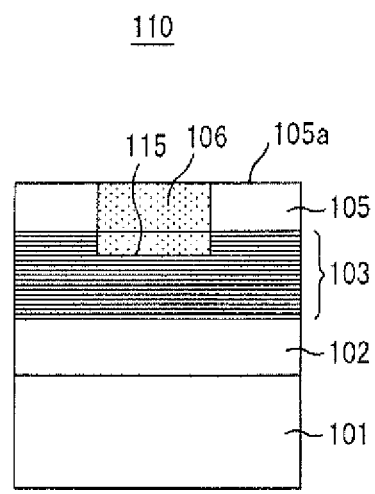
FIG. 6 is a sectional view illustrating a light-receiving element in Reference example 2, which is different from the present invention.
Figure 7:
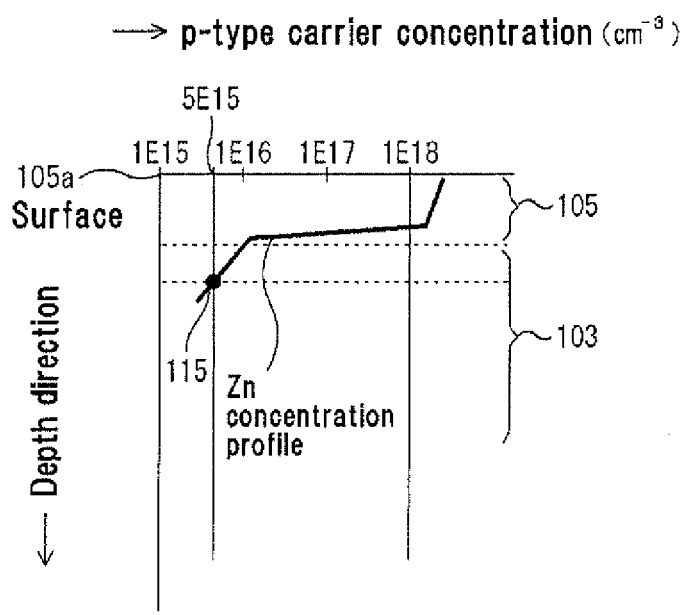
FIG. 7 illustrates a Zn concentration distribution in the light-receiving element in FIG. 6.

FIG. 6 is a sectional view illustrating a light-receiving element 110 in Reference example 2 for discussing these cases (1) and (2). The light-receiving element 110 in Reference example 2 has a laminated structure that is substantially the same as that of the light-receiving element in Reference example 1, but has an InP window layer 105 having a larger thickness than that in Reference example 1. Thus, Reference example 2 corresponds to the case (2); however, the case (1) can also be discussed with Reference example 2. In the laminated structure illustrated in FIG. 6, Zn is selectively diffused such that a high-concentration region thereof is not formed in the multi-quantum well structure of the light-receiving layer 103. As a result, the Zn concentration distribution illustrated in FIG. 7 is provided. In the Zn concentration distribution illustrated in FIG. 7, the concentration of Zn sharply drops from a high concentration to a low concentration within the InP window layer 105, and a region that is close to the light-receiving layer 103 and has a low impurity concentration of about 1E16 $cm^{-3}$ is formed within the InP window layer 105.

When such a region having a low impurity concentration of about 1E16 $cm^{-3}$ is formed within the InP window layer 105, as has been repeatedly described, the electrical resistance is increased and the response speed is decreased in the region. Accordingly, a material having so large a band gap energy that a window layer is formed, specifically, the window layer 105 composed of InP, which is a typical material, cannot play the role of a diffusion concentration distribution control layer. This holds true for the cases (1) and (2). Accordingly, the diffusion concentration distribution control layer is preferably formed of a material having a band gap energy equal to or less than that of InP, specifically, less than 1.34 eV. That is, a material such as InGaAs needs to be used in which, even in a low impurity concentration region thereof, a decrease in the electrical conductivity is relatively small and an increase in the electrical resistance is relatively small.

Second Embodiment

Image Pickup Device

Figure 8:
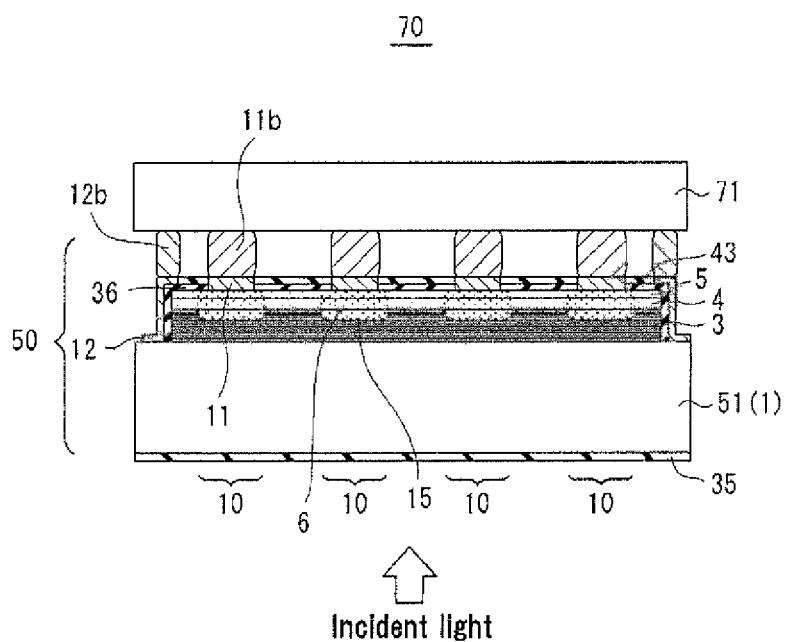
FIG. 8 is a schematic view illustrating an image pickup device according to a second embodiment of the present invention.
Figure 9:
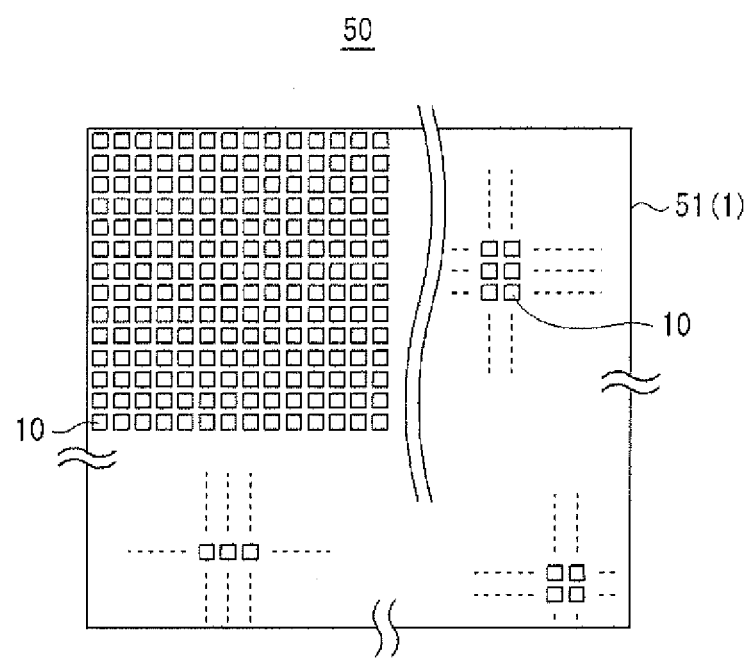
FIG. 9 illustrates a light-receiving element array of the image pickup device in FIG. 8.
Figure 10:
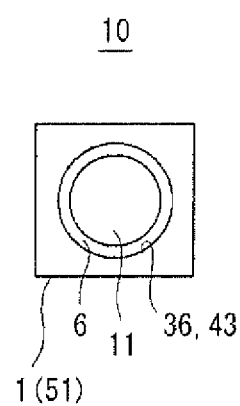
FIG. 10 illustrates a single light-receiving element in the light-receiving element array in FIG. 9.

FIG. 8 is a schematic view illustrating an image pickup device according to a second embodiment of the present invention. Optical parts such as a lens are omitted. FIG. 9 is an explanatory view illustrating the light-receiving element array of the image pickup device. FIG. 10 illustrates a single light-receiving element in the light-receiving element array 50 in FIG. 9. In FIG. 8, in this image pickup device 70, the light-receiving elements 10 formed on a common InP substrate 51 are mounted such that the epitaxial-layer side thereof faces a multiplexer (complementary metal-oxide-semiconductor: CMOS) 71 having the function of a mounting substrate. The p-side electrodes 11 electrically connected to the p-type regions 6 of epitaxial layers of the light-receiving elements 10 and the n-side electrodes 12 provided on the common n-type InP substrate 51 (1) are connected to the multiplexer 71. The p-side electrodes 11 and the n-side electrodes 12 send electrical signals to the multiplexer. The multiplexer 71 receives electrical signals from the light-receiving elements 10 and performs processing of the formation of the whole image of the subject. The n-side electrodes 12 and the p-side electrodes 11 are electrically connected to the multiplexer 71 through solder bumps 12b and 11b, respectively. Incident light is introduced through an anti-reflection (AR) film 35 formed on the back surface of the InP substrate 51 and received at the pn junctions 15, which are the interfaces between the p-type regions 6 and the light-receiving layer 3. The p-type regions 6 are formed by introducing Zn through openings of the Zn selective diffusion mask pattern 36 that is composed of SiN and also serves as a protective film. The Zn diffusion mask pattern 36 is left together with a polyimide film pattern 43 that is formed thereon and serves as a protective film. The structures of the light-receiving element array and the light-receiving elements will be described below in detail with reference to FIGS. 9 and 10.

In FIG. 9, the light-receiving elements 10 of the light-receiving element array 50 are disposed on the common InP substrate 51 (1). Current signals are generated by receiving cosmic light in the SWIR band with the light-receiving elements. As described above, the current signals are sent to the multiplexer 71 also serving as a mounting substrate and are processed to form images. By changing the size or pitch of the light-receiving elements or the size of the array, the number of pixels is changed. The light-receiving element array 50 illustrated in FIG. 9 has 90,000 pixels. The light-receiving element 10 illustrated in FIG. 10 includes a plurality of epitaxial films formed on the InP substrate 1 and, in addition, the diffusion mask 36 that has been used for introducing a p-type impurity to form the p-type region 6. The p-portion electrode 11 is connected to the p-type region 6. The p-portion electrode 11 is connected to, for example, the wiring of the mounting substrate such as the multiplexer 71 through a solder bump or the like.

Figure 11:
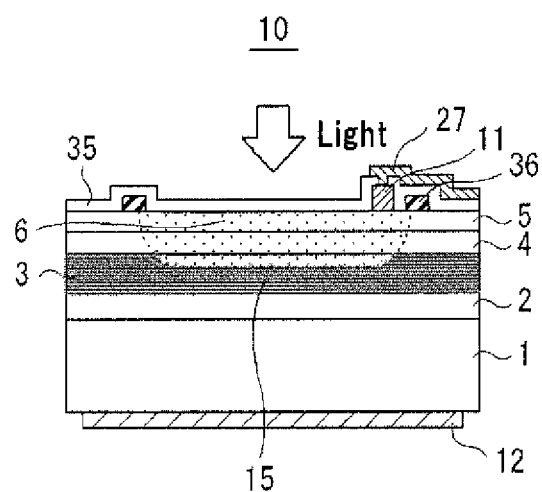
FIG. 11 is a sectional view illustrating a light-receiving element that is mounted in an epi-up configuration.

FIG. 11 is a sectional view illustrating a light-receiving element 10 that is mounted in an epi-up configuration. In the present invention, light-receiving elements in an image pickup device may be mounted in an epi-down configuration or an epi-up configuration. The light-receiving element 10 includes, in ascending order, on an n-type InP substrate 1, n-type InP buffer layer 2/light-receiving layer 3/diffusion concentration distribution control layer 4/InP window layer 5/selective diffusion mask pattern 36/anti-reflection film (AR film) 35. The p-type region 6 is formed so as to extend from the InP window layer 5 through the diffusion concentration distribution control layer 4 to a pn junction 15 in the light-receiving layer 3. An n-side electrode 12 is disposed on the back surface of the n-type InP substrate 1. A p-side electrode 11 is disposed on the surface of the InP window layer 5 and in the p-type region 6 and is electrically connected to a wiring electrode 27. In the second embodiment, the light-receiving layer 3 receives light in the wavelength range of 1.0 to 3.0 μm. Specifically, the light-receiving layer 3 is formed so as to have the type II multi-quantum well structure described above.

The light-receiving element 10 illustrated in FIG. 11 is mounted in an epi-up configuration as described above and light is incident on the epitaxial layer side, that is, the InP window layer 5 side of the light-receiving element 10. As described above, a light-receiving element according to the second embodiment may be a light-receiving element illustrated in FIG. 12 that is mounted in an epi-down configuration in which light is incident on the back surface side of the n-type InP substrate 1. In the case of the epi-down mounted light-receiving element 10 illustrated in FIG. 12, an AR film 35 is formed on the back surface of the InP substrate 1. The diffusion concentration distribution control layer 4, the InP window layer 5, the p-side electrode 11, and the selective diffusion mask pattern 36 that is composed of SiN and also serves as a protective film are formed in the same manner as in the mounting in the epi-up configuration. In the mounting in the epi-down configuration illustrated in FIG. 12, InP of the InP substrate 1 and the like is transparent to the SWIR-band light and hence the SWIR-band light reaches the pn junction 15 of the light-receiving layer 3 without being absorbed. In the structure illustrated in FIG. 12, the light-receiving layer 3 also has the type II multi-quantum well structure described above. This is the same as in embodiments according to the present invention below unless otherwise specified.

Figure 12:
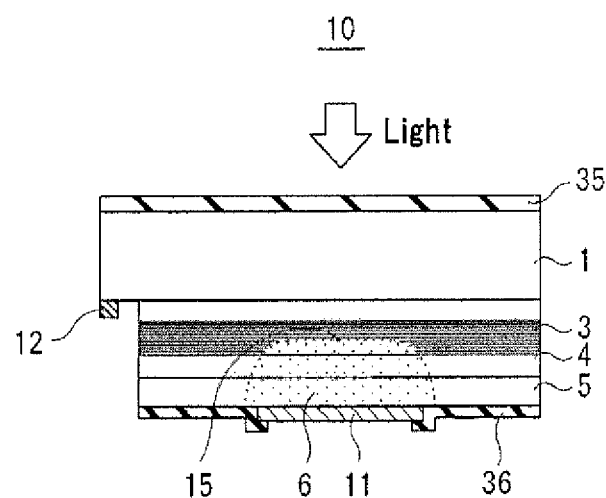
FIG. 12 is a sectional view illustrating a light-receiving element that is mounted in an epi-down (flip-chip) configuration.

The p-side electrode 11 and the n-side electrode 12 may be disposed so as to face each other with the n-type InP substrate 1 therebetween as illustrated in FIG. 11, or so as to be on the same side of the n-type InP substrate 1 as illustrated in FIG. 12. In the case of the structure illustrated in FIG. 12, the light-receiving elements 10 of the light-receiving element array 50 illustrated in FIG. 9 are electrically connected to an integrated circuit by flip-chip mounting. In a light-receiving element having the structure illustrated in FIG. 11 or 12, light having reached the pn junction 15 is absorbed to generate current signals and, as described above, the current signals are converted into an image for a single pixel by the integrated circuit.

The n-type InP substrate 1 is desirably an off-angle substrate that is inclined by 5° to 20° in [111] direction or [11-1] direction with respect to (100), more desirably, by 10° to 15° in [111] direction or [11-1] direction with respect to (100). By using such a substrate having a large off angle, the n-type InP buffer layer 2, the light-receiving layer 3 having the type II quantum well structure, the InGaAs diffusion concentration distribution control layer 4, and the InP window layer 5 that have a low defect density and excellent crystal quality can be provided. As a result, dark current is suppressed and a light-receiving layer in which the number of black dots is small can be provided. Accordingly, a light-receiving layer can be provided with which the performance of an apparatus that captures images by receiving weak cosmic light in the SWIR band can be considerably enhanced. That is, the advantage of a light-receiving element formed with such an off-angle substrate is particularly useful for enhancing the quality of an image pickup device that captures images by receiving cosmic light.

The above-described large off angles of InP substrates have never been proposed and have been firstly confirmed by the inventors of the present invention. Such a large off angle is an important factor in the cases of growing an epitaxial film having good crystal quality on an InP substrate. For example, consider a case where the light-receiving layer 3 having the above-described quantum well structure that can emit and receive light in a very long wavelength range contains a N-containing compound semiconductor such as GaInNAs. In this case, unless an InP substrate having such a large off angle is used, the light-receiving layer 3 actually cannot be formed as a practical good epitaxial layer. Specifically, unless an InP substrate having such a large off angle is used, a N-containing compound semiconductor such as GaInNAs does not form a light-receiving layer in which dark current is suppressed and the number of black dots is reduced. As a result, clear images cannot be provided with weak cosmic light in the SWIR band. As for not only GaInNAs described above as an example but also GaInNAsP and GaInNAsSb, to achieve good crystal quality, an InP substrate is required to have an off angle in the above-described large-angle range.

The light-receiving element 10 illustrated in FIG. 11 or 12 includes the InGaAs diffusion concentration distribution control layer 4 and the InP window layer 5 that are disposed so as to cover the light-receiving layer 3. Since the lattice constant of the light-receiving layer 3 is the same as that of the n-type InP substrate 1, the InGaAs diffusion concentration distribution control layer 4 and the InP window layer 5 that are regarded for the function of decreasing dark current can be formed on the light-receiving layer 3. Accordingly, dark current is suppressed and the reliability of the element can be enhanced. Specifically, in an existing light-receiving element, a step buffer layer or a graded layer is disposed such that the lattice constant increases from the InP substrate to InGaAs of the light-receiving layer. In such a structure, the window layer needs to be an InAsP window layer having a composition with a lattice constant corresponding to that of the light-receiving layer. In general, since such an InAsP window layer having a composition with such a large lattice constant has absorption in the range of the neighborhood of mid-wave infrared (MWIR) to shorter wavelengths, the light-receiving sensitivity is poor and, in particular, in environments having a high water content, unclear images are provided (refer to FIG. 27). In the light-receiving element 10 illustrated in FIG. 11 or 12, since the light-receiving layer 3 has a lattice constant substantially the same as that of the n-type InP substrate 1, the diffusion concentration distribution control layer 4 can be composed of InGaAs and the window layer can be constituted by an InP layer. Accordingly, dark current can be suppressed to a low level.

Third Embodiment

Visibility Support Apparatus

Figure 13:
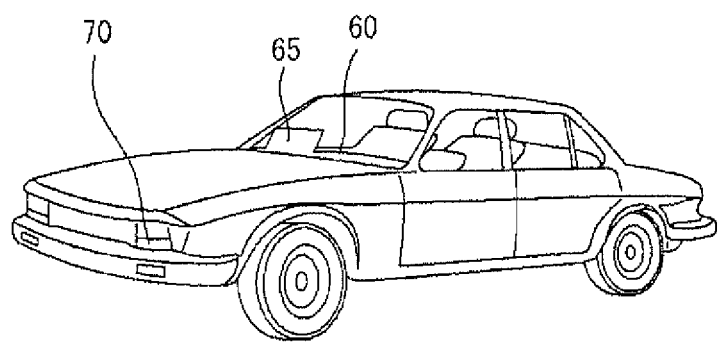
FIG. 13 illustrates a visibility support apparatus according to a third embodiment of the present invention.
Figure 14:
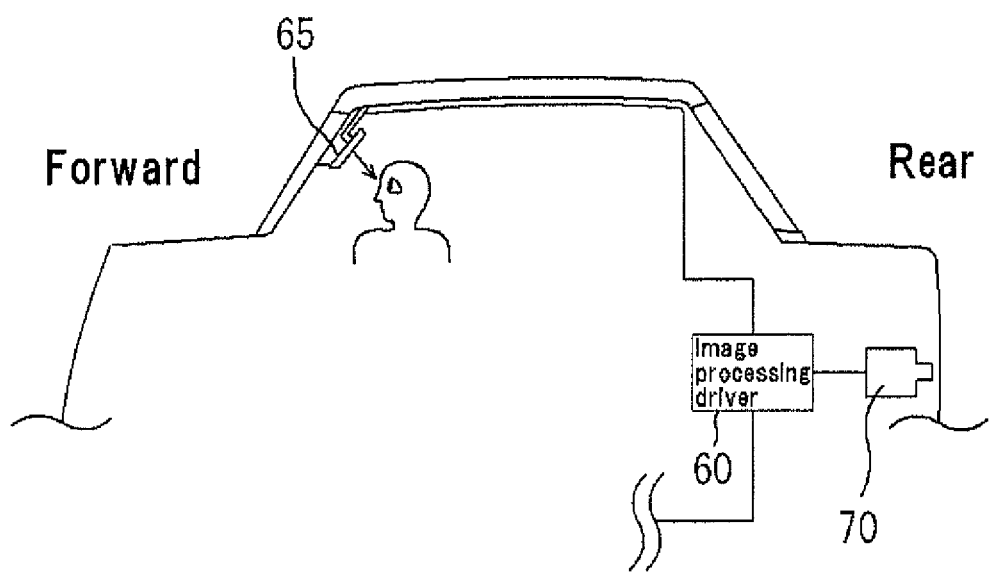
FIG. 14 illustrates a modification of the visibility support apparatus in FIG. 13.

FIG. 13 illustrates a visibility support apparatus according to a third embodiment of the present invention. This visibility support apparatus is mounted on an automobile for the purpose of enhancing the forward vision of the driver driving the automobile at night. An image pickup device 70 including the light-receiving element array and optical elements such as a lens (not shown), described in the first and second embodiments, a display monitor 65 for displaying captured images, and a control device 60 for driving and controlling the image pickup device 70 and the display monitor 65 are mounted on the automobile. FIG. 14 illustrates a visibility support apparatus mounted on an automobile for the purpose of enhancing the rear vision of the driver driving the automobile at night. An image pickup device 70 including the light-receiving element array, optical elements such as a lens, and the like, described in the second embodiment, is attached to a back portion of the automobile so as to face the rear. The images captured by the image pickup device 70 are displayed in a display device 65 located at a position in front of and above the driver. The image pickup device 70 and the display device 65 are driven and controlled by a control device 60.

Since existing vehicle visibility support apparatuses receive reflected light or emitted light in the infrared region from objects to form images, there are the following problems. When reflected light is utilized, a light source is necessary, which requires a mounting space thereof and incurs extra cost. When radiant heat from objects is utilized, it is difficult to detect non-heat-emitting objects other than people, pedestrians wearing an outfit for cold weather, and the like, and hence another detection means other than infrared cameras needs to be used in combination. When a light source is used, depending on the wavelength range used, influences on human bodies, specifically, eye safety needs to be considered.

The visibility support apparatuses according to the third embodiment do not require such an extra light source or consideration for eye safety. In addition, the visibility support apparatuses function regardless of whether subjects whose images are captured generate heat or not. Furthermore, the visibility support apparatuses can provide clear images of subjects even in environments containing moisture such as fog. Accordingly, vehicle visibility support apparatuses that function excellently at night can be provided. This is because light-receiving elements are used that employ reflected light of cosmic light in the SWIR band from objects, and have sufficiently low dark current and an excellent dynamic range (S/N).

Fourth Embodiment

Night Vision Device

Figure 15:
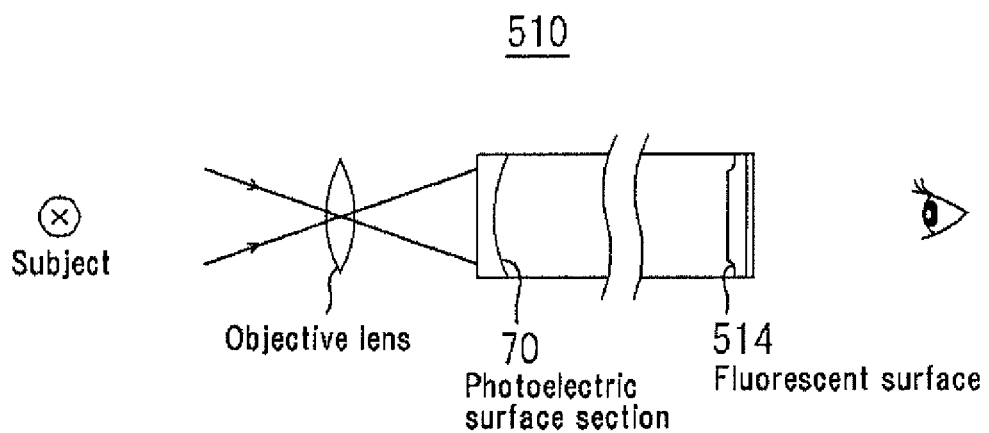
FIG. 15 is an explanatory view of the structure of a night vision device according to a fourth embodiment of the present invention.

FIG. 15 illustrates the configuration of a night vision device according to a fourth embodiment of the present invention. This night vision device 510 has a feature that, as a section for forming an image of a subject, the image pickup device 70 according to the second embodiment of the present invention or an image pickup device in which the two-dimensional arrangement surface of the light-receiving elements of the image pickup device 70 is changed to a curved surface or the like is used. Since the image pickup device 70 has a high light-receiving sensitivity from the near-infrared region to the infrared region and can suppress dark current, a light source such as an infrared-light-emitting device is not required to be included in the night vision device. In addition, as described below, an essential difference can be made in the basic performance of night vision devices, compared with existing night vision devices including infrared light sources.

Light in the near-infrared region to the infrared region such as cosmic light is reflected by a subject. This light passes through an objective lens and then forms an image in a photoelectric surface section 70. Current provided by photoelectric conversion at the photoelectric surface section 70 is amplified by any means currently used and is converted into an image and the image is displayed in a display section. The display surface may be selected in accordance with the amplification mechanism: for example, in the case of taking out current from each pixel at the photoelectric surface and amplifying the current with an amplification circuit, a liquid crystal display may be used; and, in the case of amplification with an image intensifier, an image may be displayed on a fluorescent surface and observed through an eyepiece. The image intensifier is constituted by a micro channel plate MCP that multiplies an electronic image provided by conversion at a photoelectric surface section; a fluorescent surface that is disposed behind the MCP and converts the electronic image back into an optical image; and a fiber plate that is disposed behind the fluorescent surface, divides the converted optical image of the subject into pixels, and sends the pixels.

Existing night vision devices include infrared-light-emitting diodes in the bodies thereof and receive infrared light emitted from the infrared-light-emitting diodes and reflected by subjects to obtain night-vision images of the subjects. However, in the night vision device 510 according to the third embodiment, the photoelectric surface section 70 is constituted by a two-dimensional array or an image pickup device including the light-receiving elements 10 described in the first embodiment, and hence a light-receiving layer having a high sensitivity in the near-infrared region is used. Accordingly, the night vision device 510 receives cosmic light (night glow) or the like reflected by subjects to provide practically usable clear night-vision images without infrared-light-emitting diodes installed in the body thereof. As a result, the weight and size of night vision devices are decreased and night vision devices can be readily carried, and eye-safety problems due to radiation of infrared rays can be avoided. Furthermore, when animals are being watched, some animals (for example, snakes) notice infrared radiation. Thus, in particular, a night vision device according to the embodiment is suitably used for, for example, watching behaviors of animals at night.

Fifth Embodiment

Navigation Support Apparatus (1)

Figure 16:
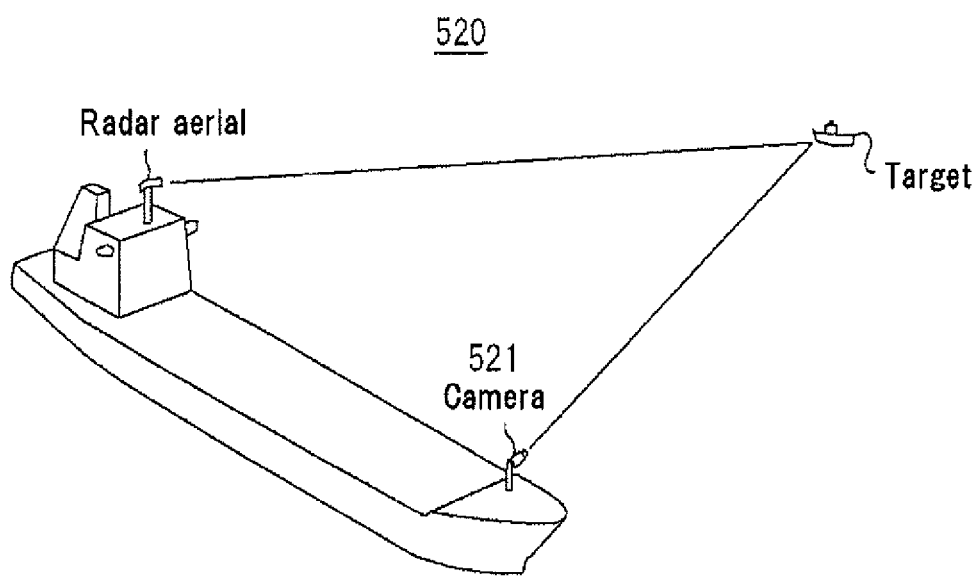
FIG. 16 is an explanatory view of a night navigation support apparatus according to a fifth embodiment of the present invention.

FIG. 16 is a perspective view for illustrating a night navigation support apparatus 520 according to a fifth embodiment of the present invention. Referring to FIG. 16, the night navigation support apparatus 520 includes a radar device including a radar aerial and the like. The radar aerial is disposed at a vantage point on a ship. The radar aerial is rotated in a horizontal plane by a control circuit or the like (not shown) to acquire targets such as other ships around the ship. A radar indicator disposed within the ship indicates the targets acquired by the radar aerial and outputs signals representing relative positions of the targets with respect to the ship.

As illustrated in FIG. 16, a camera 521 is disposed at a predetermined position (a position of a predetermined distance away from the radar aerial) on the ship. The camera 521 has a feature of including the image pickup device 70 including the light-receiving layer 3 described in the second embodiment. For example, the camera 521 is mounted on a camera mount including a horizontal-axis motor and a vertical-axis motor, and the orientation of the camera 521 can be controlled around the vertical axis and the horizontal axis. The camera 521 is activated when a target is acquired in the radar indicator and the target is selected as a subject whose images are captured. The horizontal-axis motor and the vertical-axis motor that are included in the camera mount are driven such that the camera 521 continues to shoot the target and the target continues to be displayed on a display section. To perform such tracking and shooting with the camera 521, a target tracking computing unit is provided. When a certain target is set as a tracking target, the target tracking computing unit activates the camera 521 and starts to control the driving of the motors included in the camera mount to thereby make the camera 521 start tracking and shooting the target.

Since existing infrared cameras detect the temperature difference between a target and the environment or infrared light emitted from a target, it has been difficult to detect, for example, targets whose temperature is not different from the environment. When extra infrared radiation means is provided, it is difficult to provide a sufficient amount of infrared light over a wide area. As described above, since the camera 521 includes the image pickup device 70 according to the second embodiment, the camera 521 has an excellent sensitivity in the near-infrared region, is not required to utilize temperature difference, functions regardless of whether it is day or night, and is not influenced by sea surface temperature. In addition, since the camera 521 has a high sensitivity in a wavelength range that is less likely to be influenced by water vapor, the camera 521 is less likely to be influenced by rain, fog, or the like and can clearly shoot targets even in the night.

Sixth Embodiment

Navigation Support Apparatus (2)

Figure 17:
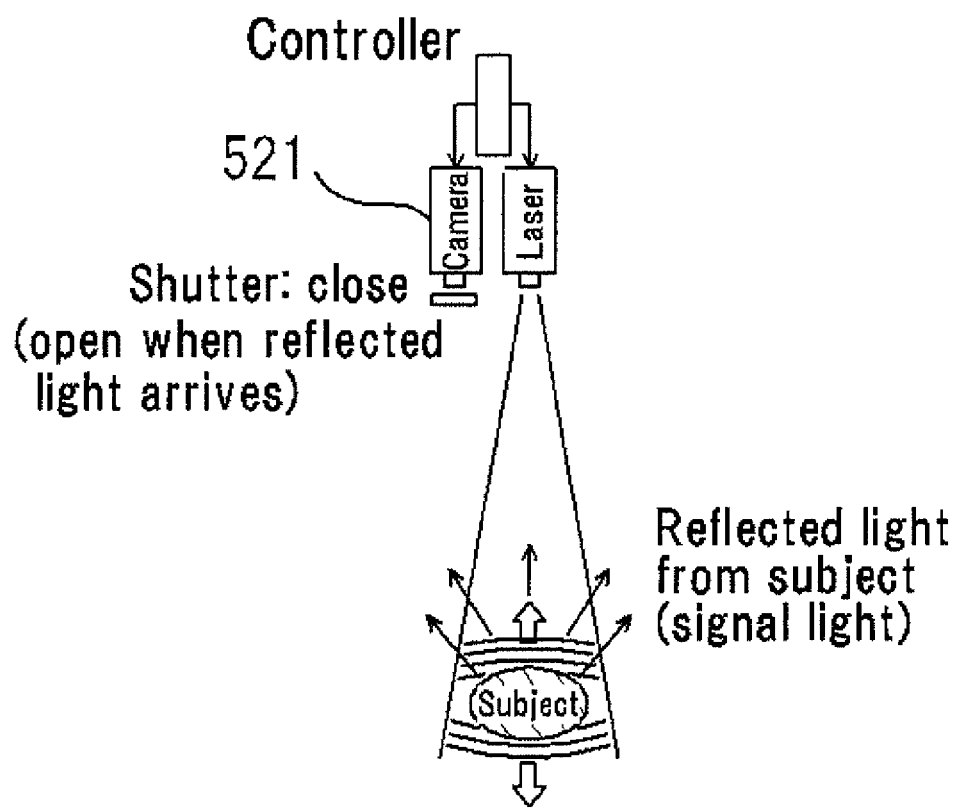
FIG. 17 is an explanatory view of a laser radar of a night navigation support apparatus according to a sixth embodiment of the present invention.

FIG. 17 is an explanatory view for the principle of a laser radar serving as the core of a night navigation support apparatus according to a sixth embodiment of the present invention. The laser radar according to the sixth embodiment has a feature of including a camera including the image pickup device 70 according to the second embodiment. The rotational pedestal for rotating the laser radar has a function of changing the elevation angle and rotating and is controlled by a control circuit.

The laser radar including the camera includes a laser head, a light-transmitting optical system, a zoom lens for receiving light, a camera head, and the like. The laser head is constituted by a semiconductor laser that emits invisible extremely short pulse laser light in a wavelength band in the near-infrared region, and the like. The camera head is constituted by the camera 521 that receives the pulse laser light having been reflected, and the like.

Referring to FIG. 17, the principle of a laser radar of a night navigation support apparatus according to the sixth embodiment will be described. Although pulse laser light is radiated toward a subject, there are floating particles of rain, fog, or the like on the way to the subject. When the laser emits laser light toward the subject, since the shutter of the camera 521 is closed, light reflected by floating particles of rain, fog, or the like in front of the subject is blocked by the shutter and does not reach the camera 521. Then, as illustrated in FIG. 17, the light reaches the subject and is reflected and the shutter is opened at the instant when the reflected light reaches the camera 521. Thus, the reflected light from the subject that is separated by a certain distance can be exclusively received.

In the laser radar, the timing at which the shutter is opened can be adjusted in accordance with the distance to a subject. In addition, by using the camera 521 having a high sensitivity, a subject can be exclusively watched regardless of whether it is day or night and even in bad weather such as rain or fog or in high waves while influences due to such factors can be considerably reduced. Subjects composed of nonferrous materials such as small ships formed of wood or plastic or objects floating on the sea surface can also be clearly visually recognized as can the shapes thereof. Furthermore, in the camera 521, the image pickup device 70 according to the second embodiment is combined with an image intensifier functional component. Accordingly, for example, the wavelength range of laser light from the laser radar can be set in the near-infrared region, which is less likely to be influenced by rain or fog, and hence clearer images can be provided.

Seventh Embodiment

Monitoring Device (1)

Figure 18:
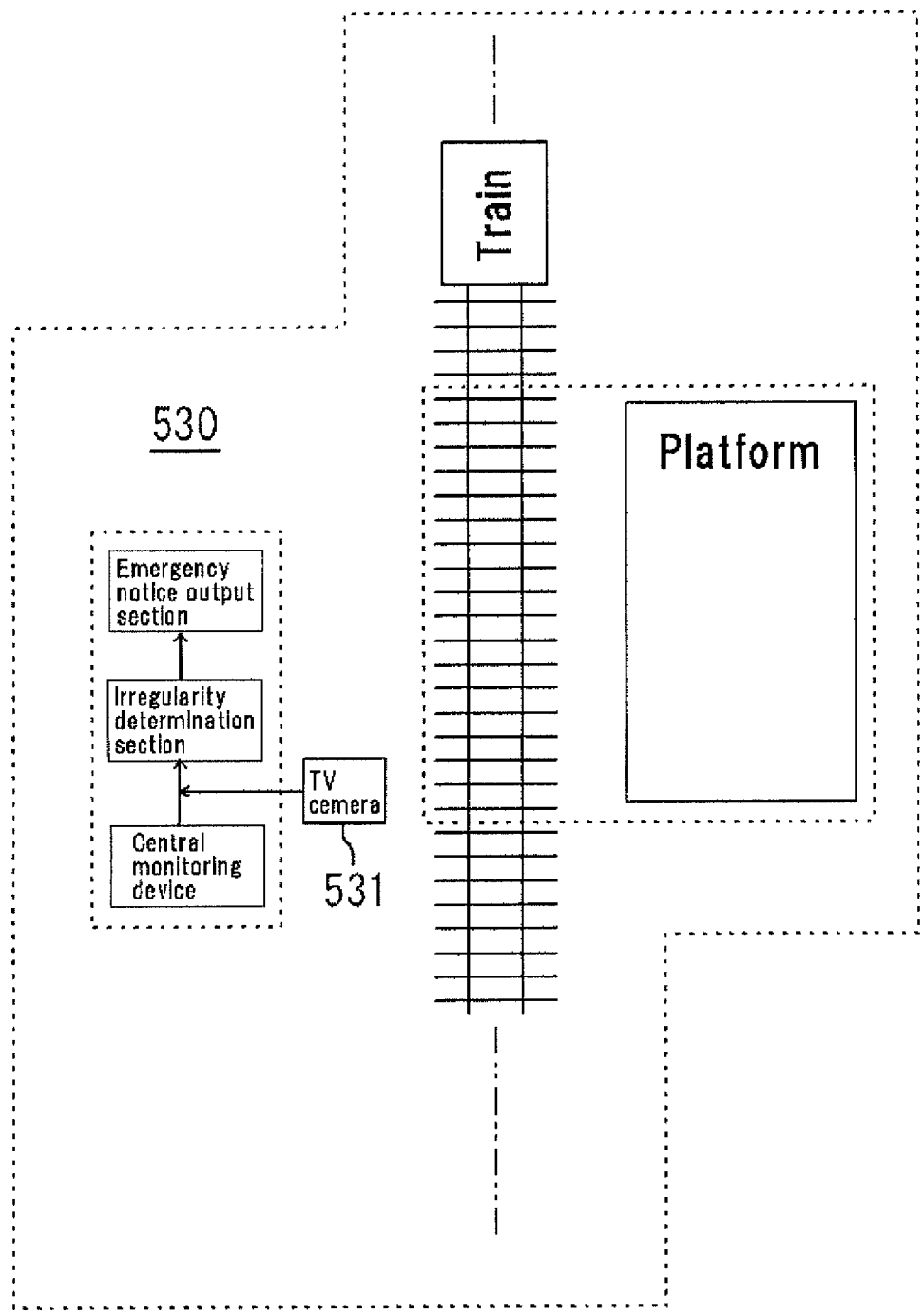
FIG. 18 is an explanatory view of a train-accident avoidance apparatus according to a seventh embodiment of the present invention.

FIG. 18 illustrates a train-accident avoidance apparatus 530 according to a seventh embodiment of the present invention. A feature of the seventh embodiment is that a TV camera 531 includes the image pickup device 70 according to the second embodiment. In FIG. 18, the train-accident avoidance apparatus includes the TV camera 531 that monitors a predetermined region by capturing images of the region; an irregularity determination section; a central monitoring device that quickly addresses an obstacle that enters the railway track and is detected by the TV camera 531, to prevent an accident; and an emergency notice output section that notifies the occurrence of a state of emergency.

As for the TV camera 531, one or more TV cameras 531 are disposed so as to monitor a predetermined region, for example, the entire length of the railway track built in the area of a platform. When a single TV camera 531 is disposed, the image capturing area thereof covers the railway track in front of a train and the platform.

Since the TV camera 531 includes the image pickup device 70 illustrated in FIG. 8, clear images can be provided. In addition, the TV camera 531 has a high sensitivity in a wavelength range that is less likely to be influenced by moisture even in rain, fog, or the like. Accordingly, surveillance can be performed with certainty without being influenced by the weather. In addition, the necessity of radiating infrared rays or the like has been eliminated and hence eye-safety problems for many passengers can be avoided.

Eighth Embodiment

Monitoring Device (2)

Figure 19:
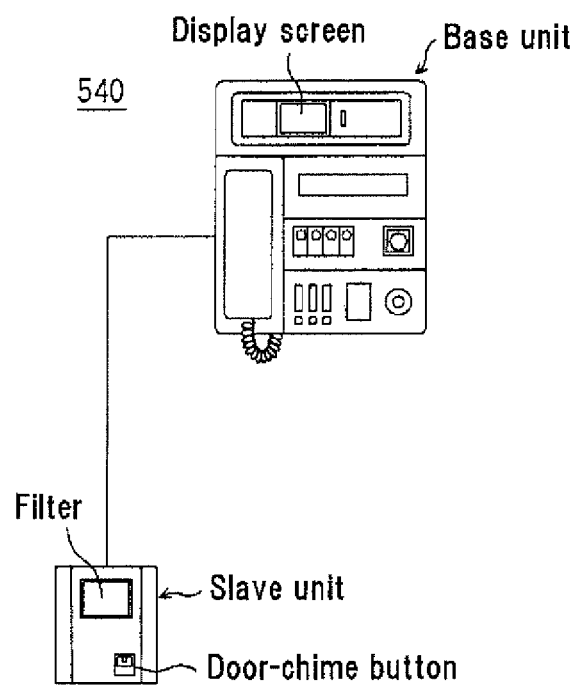
FIG. 19 illustrates a visitor monitoring device according to an eighth embodiment of the present invention.

FIG. 19 illustrates a visitor monitoring device 540 according to an eighth embodiment of the present invention. The visitor monitoring device 540 is constituted by the base unit and the slave unit of a camera-equipped door phone. The slave unit is disposed on the door. A visitor presses the button of a door chime and images of the visitor are captured through a filter. The base unit is disposed indoors. The images of the visitor captured by the camera of the slave unit are displayed on the display screen of the base unit.

Figure 20:
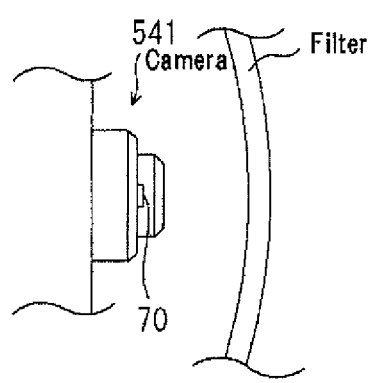
FIG. 20 is an explanatory view of a camera disposed in the slave unit of the door phone apparatus in FIG. 19.

FIG. 20 illustrates a camera 541 disposed in the slave unit. The camera 541 includes the image pickup device 70 illustrated in FIG. 8 and captures images of visitors. In the eighth embodiment, the image pickup device 70 including a light-receiving layer having a high sensitivity in the near-infrared region to the infrared region is used and, for example, visitors can be identified with reflection of cosmic light (night glow). Accordingly, the necessity of disposing an infrared-light-emitting element in the slave unit as in existing camera-equipped door phones has been eliminated. Thus, for example, there is no problem that the image of such an infrared-light-emitting element is reflected by the filter to generate a virtual image of the infrared-light-emitting element around the visitor. Accordingly, the necessity of disposing a cylindrical wall or the like around the camera for preventing this problem has been eliminated. In addition, the eye-safety problem due to radiation of infrared rays can be avoided and power for the power supply of light sources such as infrared LEDs can be saved. Thus, the structure of the slave unit of a camera-equipped door phone can be simplified, the power consumption can be reduced, and the eye-safety problem can be avoided. In addition, since natural cosmic light is constant throughout the day and night, clear images of visitors can be provided without any uncomfortable feeling due to the difference between day and night, or the like.

Ninth Embodiment

Monitoring Device (3)

Figure 21:
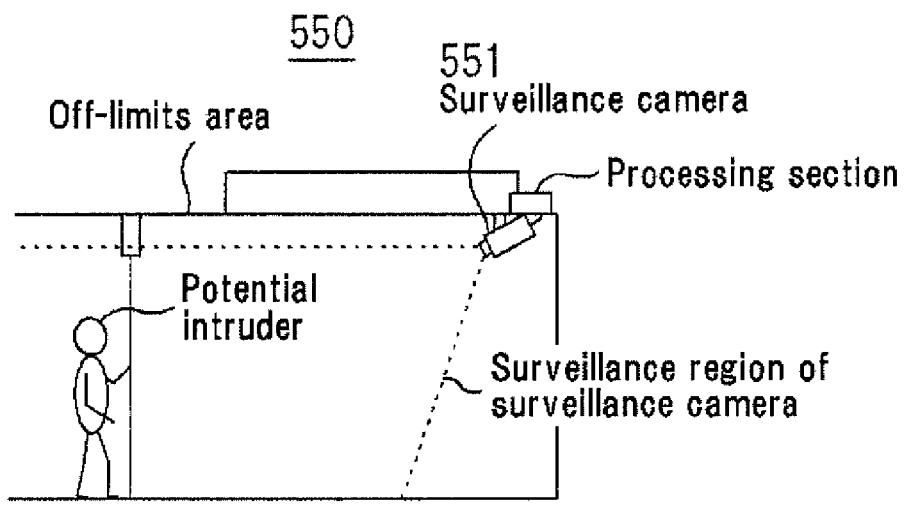
FIG. 21 is an explanatory view of an intruder monitoring device according to a ninth embodiment of the present invention.

FIG. 21 illustrates an intruder detection apparatus 550 according to an eighth embodiment of the present invention. A surveillance camera 551 is disposed indoors so as to monitor outdoors through a transparent window surface. The surveillance camera 551 includes the image pickup device 70 illustrated in FIG. 8 according to the second embodiment and has a high sensitivity in the near-infrared region to the infrared region. The surveillance camera 551 captures images. The images are sent to a processing section and processed to detect a subject person. Furthermore, the period over which the subject person stays in the neighborhood of the window surface is measured and when the period is equal to or more than a predetermined time, for example, one minute, which means high probability of intrusion, the subject person is regarded as a potential intruder.

Since the surveillance camera 551 according to the ninth embodiment includes the image pickup device 70 having a high sensitivity in the near-infrared region to the infrared region, the surveillance camera 551 has a feature that the necessity of including an infrared-radiation device has been eliminated. The surveillance camera 551 can detect potential intruders with a high identification capability by receiving cosmic light (night glow) reflected by persons. Accordingly, the configuration of such monitoring devices can be simplified. In addition, eye-safety problems that tend to be caused by intruder monitoring devices that particularly focus radiation of infrared rays on subject persons, can be avoided. Furthermore, for example, when there are a plurality of intruders, clear images of the intruders are less likely to be provided by radiation of infrared rays. However, clear data can be provided without radiating infrared rays.

Another existing monitoring device (not shown) indispensably includes infrared LEDs serving as a light source. For example, a surveillance camera is equipped with substrates that are disposed on both sides (lateral sides) of the surveillance camera such that the angle at which the substrates face forward can be freely changed by driving motors. A plurality of light-emitting LEDs are attached to the substrates. The light-emitting LEDs radiate infrared rays to a surveillance region and the surveillance camera receives reflected light of the infrared rays to capture images. When the lens of the surveillance camera is changed from a standard lens to a wide-angle lens or from a wide-angle lens to a standard lens or when a surveillance region is changed, brightness data of image signals from the surveillance camera is collected, the brightness distribution is determined and detected. When the brightness is not uniform, the facing angle of the substrates is changed by driving motors to thereby change the radiation angle of the light-emitting LEDs such that the brightness distribution is uniform.

Figure 22:
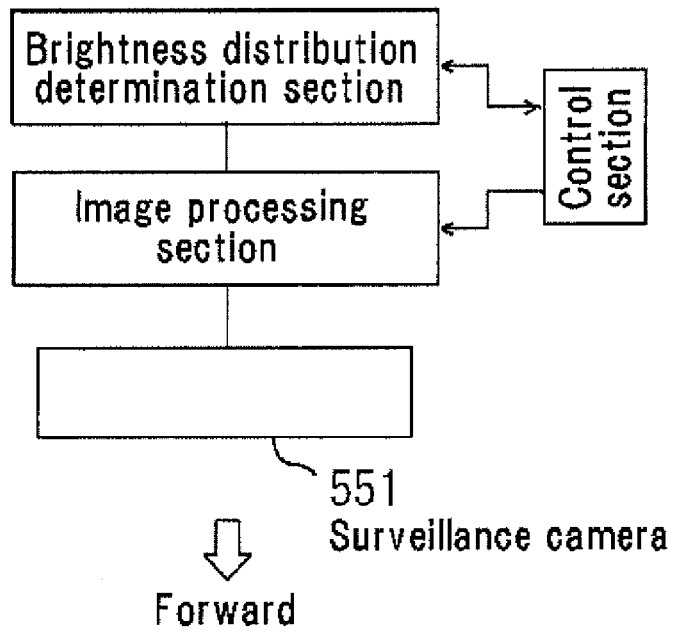
FIG. 22 is an explanatory view of a modification of an intruder monitoring device according to the ninth embodiment of the present invention.

In contrast, the surveillance camera 551 according to the ninth embodiment (modification) in FIG. 22 includes the image pickup device 70 having a high sensitivity in the near-infrared region to the infrared region. Accordingly, when the surveillance camera 551 is used for a monitoring device and is used to monitor dark places, clear images can be provided without light-emitting LEDs and the brightness distribution can be determined with a high accuracy. Furthermore, since the surveillance camera 551 can receive reflected light of cosmic light (night glow) with a high sensitivity, regardless of the cases where the lens is changed to a wide-angle lens to widen the image capturing region or vice versa, the substrates equipped with the light-emitting LEDs, motors for changing the angle, a control device for the motors, and the like can be omitted. Thus, the configuration of monitoring devices can be considerably simplified.

Tenth Embodiment

Monitoring Device (4)

Figure 23:
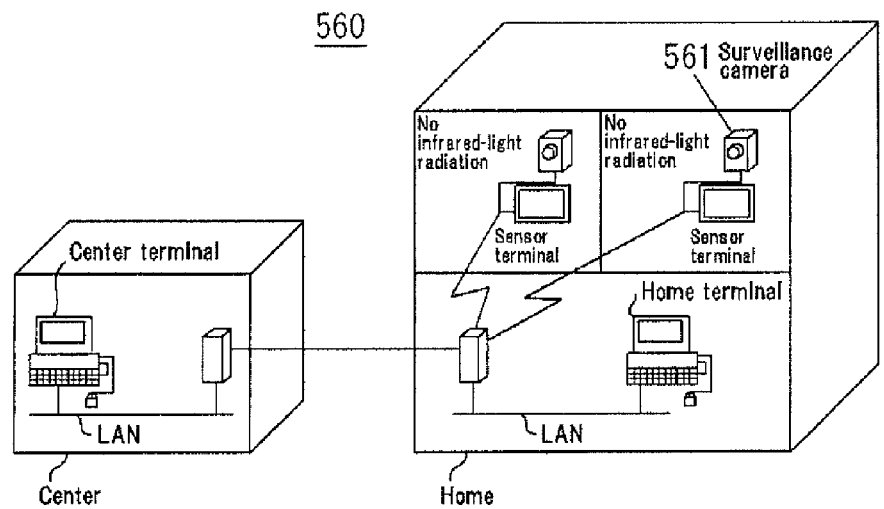
FIG. 23 is an explanatory view of an indoor monitoring device according to a tenth embodiment of the present invention.

FIG. 23 is an explanatory view illustrating an indoor monitoring device 560 according to a tenth embodiment of the present invention. In FIG. 23, surveillance cameras 561 each include the image pickup device 70 illustrated in FIG. 8 and are disposed so as to capture images of the interior of a home. Sensor terminals are formed together with the surveillance cameras as integrated units and are configured to process images captured by the surveillance cameras and to calculate the probability of the presence of persons or the like to thereby determine the presence of persons in the home. The determination results of the sensor terminals are sent to a home terminal through a local-area network (LAN) and sent from the home terminal to a center terminal in a center through telephone lines.

As long as the surveillance cameras 561 each include the image pickup device 70, the surveillance cameras 561 may be artificial retina cameras or the like. Existing infrared cameras always need to radiate infrared light over the entire living space of residents (persons requiring care) with infrared lamps and hence the influence of the infrared radiation on the persons requiring care cannot be neglected. In addition, in stationary-point surveillance, there are cases where facial expressions or behaviors of persons requiring care in places the radiation does not reach are not clearly shot and actions that should be performed are delayed. In the surveillance cameras 561, the image pickup devices 70 have a high light-receiving sensitivity in the near-infrared region to the infrared region. Accordingly, imaging with a high sensitivity can be achieved in the dark or under lighting without radiation of infrared rays. Thus, the probability of the presence of persons can be calculated with a high accuracy and delays in actions can be prevented.

Eleventh Embodiment

Monitoring Device (5)

Figure 24:
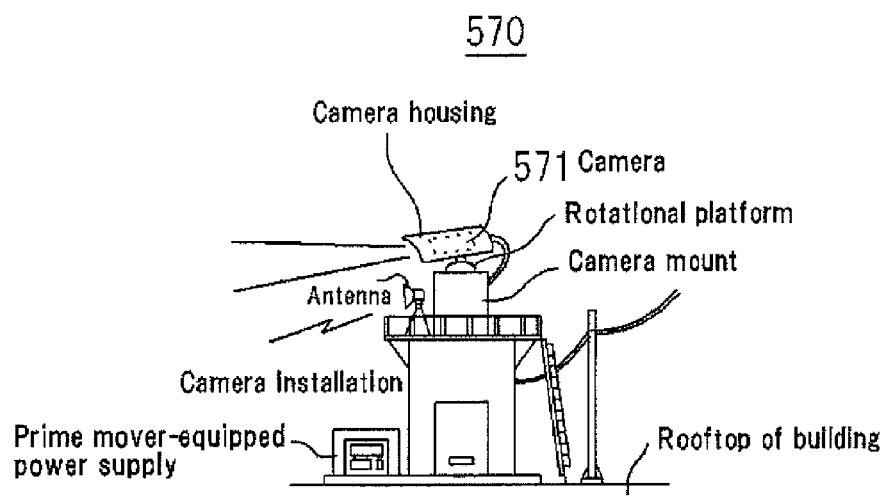
FIG. 24 is an explanatory view of an urban-disaster-prevention monitoring device according to an eleventh embodiment of the present invention.

FIG. 24 is an explanatory view illustrating an urban-disaster-prevention monitoring device according to an eleventh embodiment of the present invention. This urban-disaster-prevention monitoring device 570 allows automatic detection of a fire and easy identification of the location where the fire has broken out. For example, the urban-disaster-prevention monitoring device 570 has a configuration in which a camera mount including a rotational platform in the upper portion thereof is disposed on the rooftop of a building and a camera housing containing a surveillance camera 571 is mounted on the rotational platform. The surveillance camera 571 according to the eleventh embodiment has a feature of including the image pickup device 70 illustrated in FIG. 8. Accordingly, infrared light emitted from a fire or the like can be detected with a high sensitivity.

In the monitoring device, by driving the rotational platform on which the surveillance camera is mounted, the direction in which the surveillance camera 571 captures images is changed. At this time, by monitoring the angle, infrared images of a predetermined region in a city can be captured. By processing image signals to identify the local source of heat, the site at which the fire has broken out can be located. The directions in which the surveillance camera 571 captures images at this time are plotted with coordinate axes overlapping a bird's eye view by the monitoring device and, as a result, the site at which the fire has broken out can be accurately located. When existing infrared cameras are used to capture images of infrared light emitted from flames, large flame portions are shot as being extremely bright and having halation and there are cases where other portions are shot as being unclear. Accordingly, it has been difficult to simultaneously recognize flames and the surrounding situation. However, the surveillance camera 571 according to the eleventh embodiment includes the image pickup device 70 and detects light in the near-infrared region. Thus, halation is not caused by the presence of flames and the site of a fire and the surrounding situation can be accurately recognized.

In another existing urban-disaster-prevention monitoring device (not shown), a surveillance camera is used that captures images of infrared rays radiated from flames and serves as a fire detection sensor, and a fire determination device that processes near-infrared images captured by the surveillance camera is used to detect a fire with certainty at an early stage of the fire and to locate the site where the fire has broken out. In contrast to such an existing urban-disaster-prevention monitoring device, in the urban-disaster-prevention monitoring device according to the eleventh embodiment of the present invention, the surveillance camera that captures images of infrared rays radiated from flames includes the image pickup device 70 illustrated in FIG. 8. Accordingly, by processing near-infrared images captured by the surveillance camera of another urban-disaster-prevention monitoring device according to the eleventh embodiment, a fire can be detected with certainty at an early stage of the fire and the site where the fire has broken out can be located without being influenced by the weather or the like. Furthermore, by adding the function of a fire determination device, the situation of a fire can be inspected through near-infrared images and temperature data of a high accuracy can be provided.

Twelfth Embodiment

Monitoring Device (6)

Figure 25:
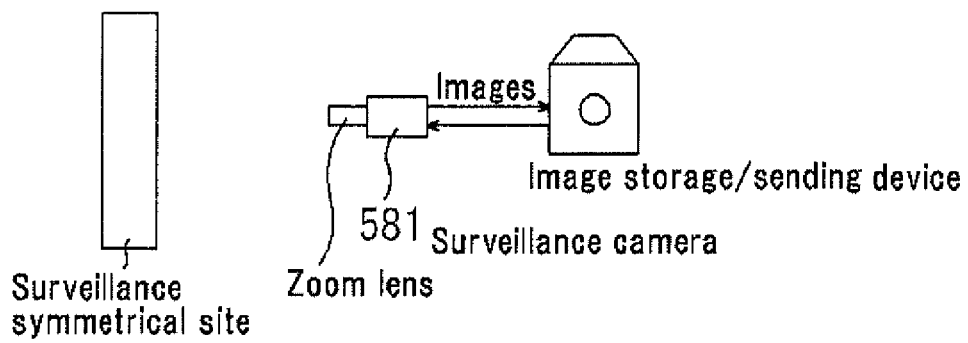
FIG. 25 is an explanatory view of a remote monitoring device according to a twelfth embodiment of the present invention.

FIG. 25 is an explanatory view illustrating a remote monitoring device 580 according to a twelfth embodiment of the present invention. This remote surveillance system 580 does not require the effort of installing electric wiring for surveillance during day and night. In addition, lighting is not necessary for surveillance at night. In the twelfth embodiment, a surveillance camera 581 has a feature of including the image pickup device 70 illustrated in FIG. 8.

In this remote surveillance system, to monitor equipment from a remote location with the surveillance camera 581, it is not necessary to dispose a luminous material or the like at the surveillance target site. The equipment that is monitored is not particularly restricted and may be any equipment, for example, drain holes for a sand-trap dam, a line indicating the water level of a dam, a line indicating the sediment level of a dam, machinery in a plant, a house, a building, a padlock for a shelf in a barriered area, an observation instrument provided in the mountains, or the like.

When a luminous material or the like is not used, the material cost of the luminous material and man-hours required for the initial deposition of the luminous material and renewal of the luminous material due to deterioration with age can be saved. In addition, problems caused in the cases where luminous materials cannot be disposed over a large area can also be overcome. Specifically, intruders passing through paths where no luminous materials are disposed and environmental situations during heavy rain cannot be recognized with locally disposed luminous materials. However, when the surveillance camera 581 including the image pickup device 70 is used, since it has a high light-receiving sensitivity from the near-infrared region to the infrared region, clear images can be provided without infrared-light-emitting devices. No infrared projectors (infrared-light-emitting devices) are naturally required. As a result, simplification of the device, a decrease in the size of the device, cost reduction, and the like can be achieved.

(Light-Receiving Region of Image Pickup Device According to Embodiment of the Present Invention, and SWIR Cosmic Light)

Figure 26:
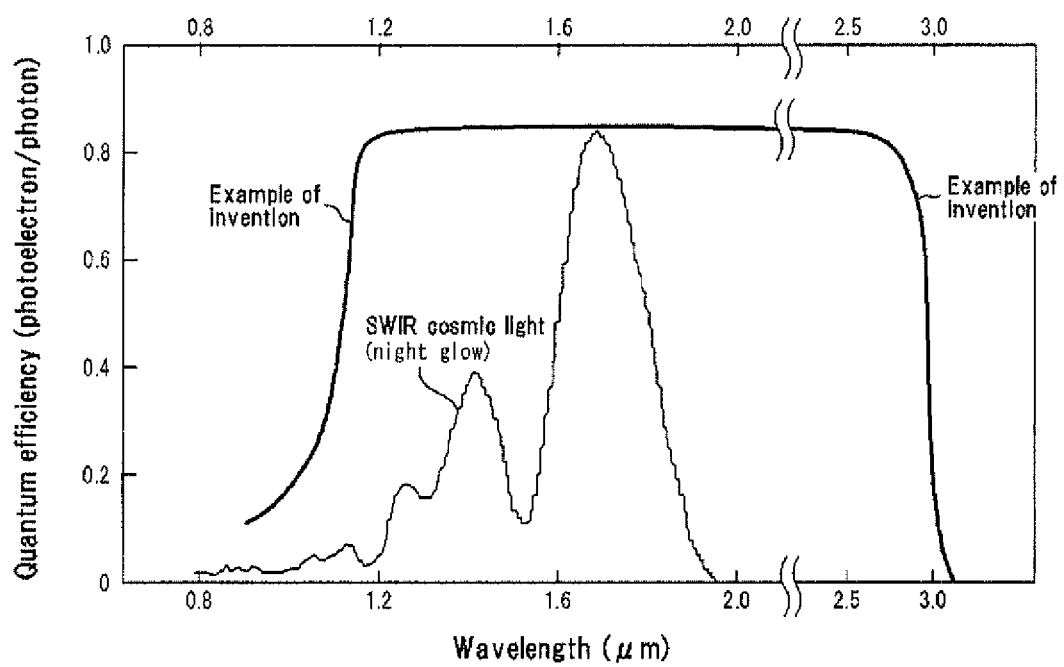
FIG. 26 illustrates the light-receiving region of an image pickup device according to an embodiment of the present invention and the intensity distribution of SWIR cosmic light.
Figure 27:
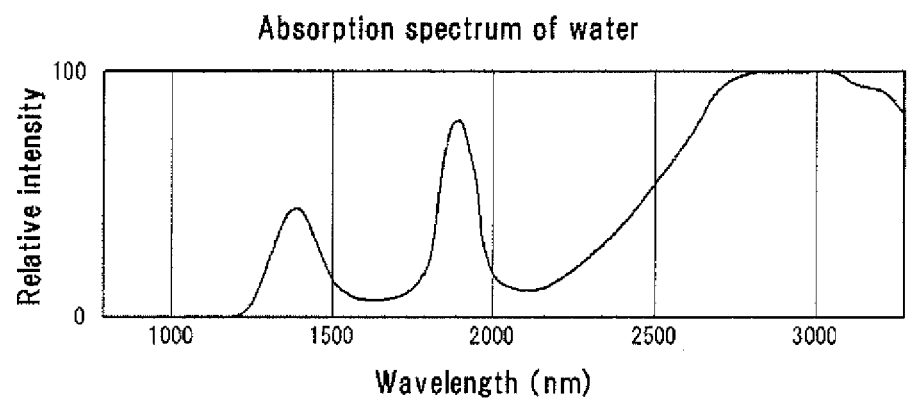
FIG. 27 illustrates the absorption spectrum of water.

An image pickup device according to an embodiment of the present invention has a light-receiving sensitivity coverage whose long-wavelength limit is about 3 μm. SWIR cosmic light has an intensity distribution illustrated in FIG. 26. As illustrated in FIG. 26, an image pickup device according to an embodiment of the present invention can cover the entire region of SWIR cosmic light. FIG. 27 illustrates the absorption spectrum of water. Thus, for example, by making an image pickup device according to an embodiment of the present invention have a light-receiving sensitivity covering a restricted region from 1 to 2 μm with a filter, influences due to water can be avoided. Therefore, influences due to rain, fog, or the like can be eliminated and clear images can be provided.

EXAMPLES

Examples in Terms of Structure of Semiconductor Light-Receiving Element Array

Figure 28:
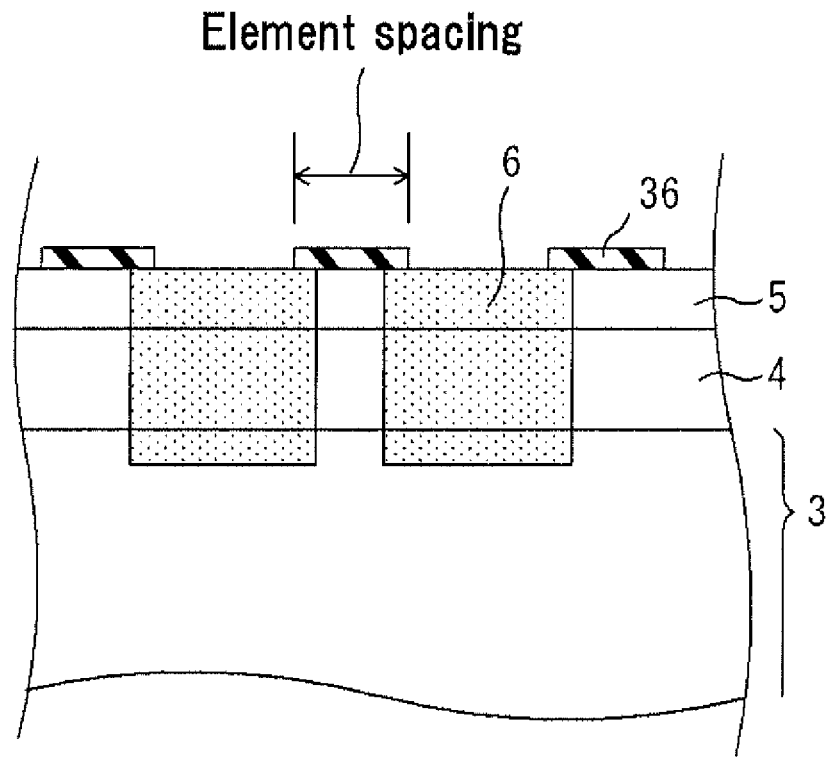
FIG. 28 is a fragmentary sectional view of a light-receiving element array used in Examples.

The degree to which the element spacing or pixel pitch of a light-receiving element array according to the present invention can be decreased was examined with examples employing a light-receiving element array illustrated in FIG. 28. As illustrated in FIG. 28, the light-receiving element spacing or pixel pitch is the width of non-opening regions of the SiN selective diffusion mask pattern 36. After the selective diffusion of Zn, the p-side electrodes 11 were formed of AuZn and the n-side electrodes 12 were formed of AuGeNi. In the case illustrated in FIG. 3, a Fe-doped semi-insulating substrate is used as the InP substrate 1 and hence the n-side electrodes 12 are disposed on the buffer layer 2 containing an impurity at a high concentration. When the n-type InP substrate 1 is used as illustrated in FIG. 1, the n-side electrodes 11 may be disposed on the back surface of the substrate or the n-side electrodes may be disposed on an n-type semiconductor layer (for example, the buffer layer 2) that is on the front surface side of the substrate and adjacent to the substrate. In Examples, while a reverse bias voltage of 5 V was applied between the p-side electrodes 11 and the n-side electrodes 12 of the light-receiving element array illustrated in FIG. 3, dark current was measured. The light-receiving element arrays were produced such that each of them had the InP window layer 5 having a thickness of 0.6 μm or 1.6 μm and one of seven element spacings ranging from 3 to 20 μm, and dark current was measured. The diffusion concentration distribution control layer 4 was made to have a thickness of 1 μm.

Figure 29:
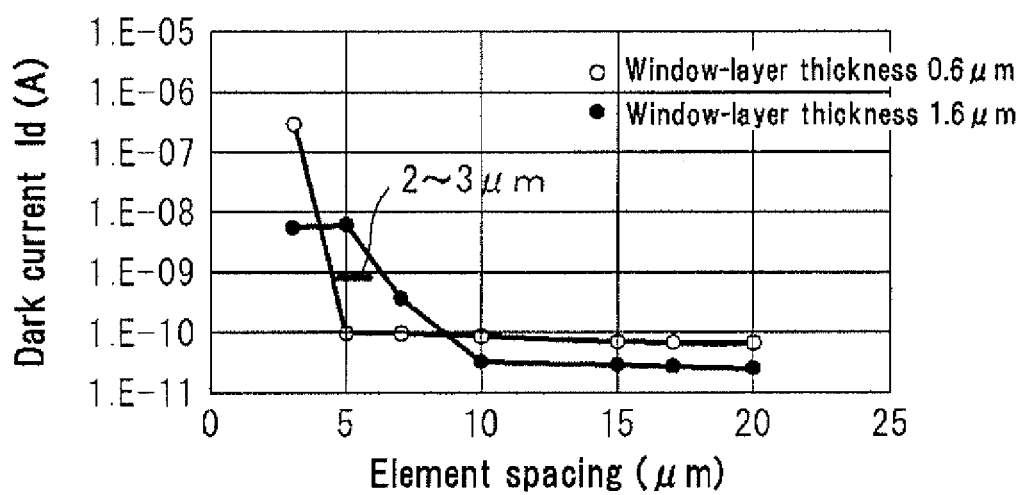
FIG. 29 is a graph illustrating the relationship between dark current measured and element spacing in Examples.

The results are illustrated in FIG. 29. FIG. 29 shows that, when the InP window layer 5 has a small thickness of 0.6 μm, even when the element spacing or pixel pitch is decreased to 5 μm, dark current is 1E-10 A (amperes). When the InP window layer 5 has a thickness of 1.6 μm, as described above, Zn diffuses in the transverse direction and 1E-10 A is achieved only when the element spacing is more than 7 μm. However, in Examples, it has been demonstrated that, by making the InP window layer 5 have a small thickness of 0.6 μm and disposing a diffusion concentration distribution control layer, the element spacing can be made 5 μm.

Figure 30:
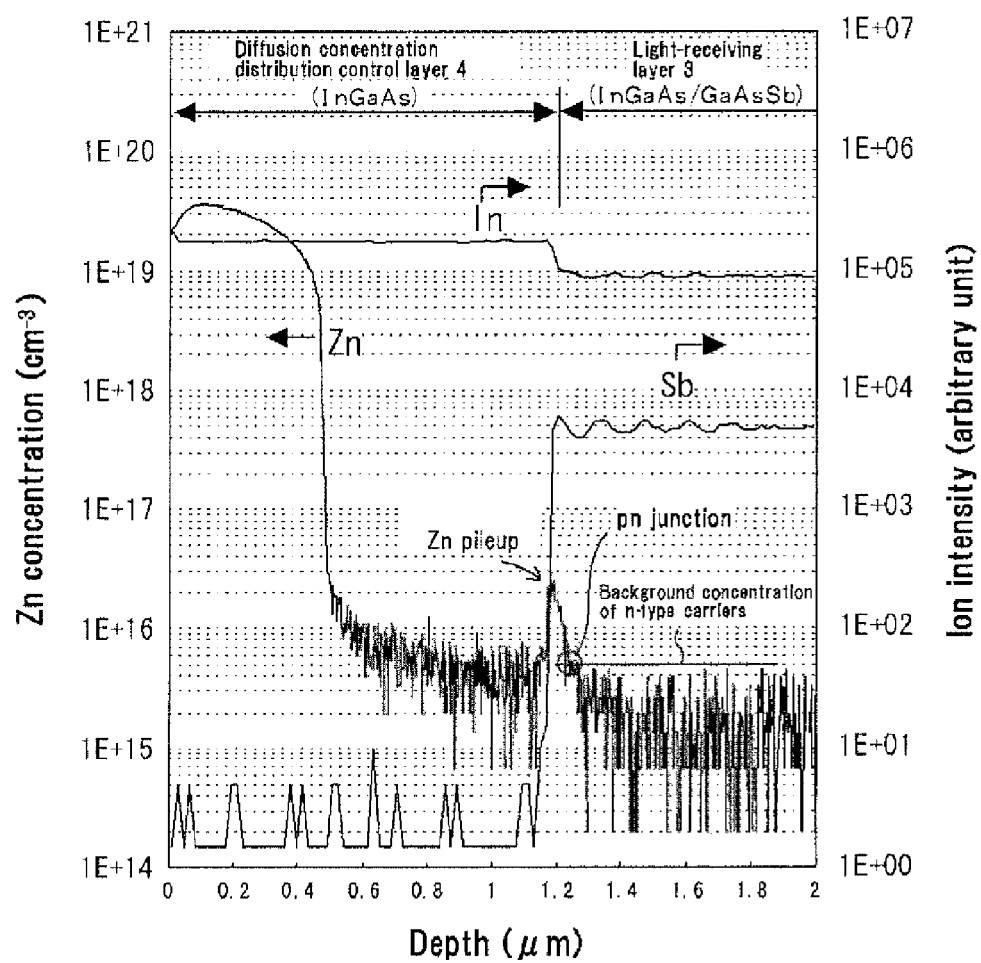
FIG. 30 illustrates a Zn concentration distribution in the depth direction in Examples.

The effect of the diffusion concentration distribution control layer 4 was examined by analyzing Zn concentration distribution in the depth direction by secondary ion mass spectroscopy (SIMS). FIG. 30 illustrates Zn concentration distribution in the depth direction. As illustrated in FIG. 30, the Zn pileup peak value is suppressed to $5 \times 10^{16}$ cm$^{-3}$ or less at the interface between the InGaAs diffusion concentration distribution control layer 4 and the light-receiving layer 3. Accordingly, in the pn junction formed at the point of intersection (circle in the figure) between the background concentration of n-type carriers of the light-receiving layer 3 and Zn concentration, the Zn concentration can be made low with certainty and degradation of crystal quality and the like can be suppressed. The disposition of the diffusion concentration distribution control layer 4 allows the multi-quantum well structure of the light-receiving layer to provide its intrinsic advantages.

Other Embodiments

As for the above-described embodiments, the light-receiving elements and the light-receiving element arrays that include the diffusion concentration distribution control layers were described. However, when most broadly understood, a light-receiving element may be constituted such that a diffusion concentration distribution control layer is not provided, but the concentration of an impurity in a multi-quantum well structure is 5E16 cm$^{-3}$ or less and the impurity is introduced by selective diffusion.

In an image pickup device that captures images by receiving cosmic light according to the present invention, when most broadly understood, as long as light-receiving elements include light-receiving layers having a quantum well structure and have a sensitivity in the range of 3.0 μm or less, the light-receiving elements may be composed of any materials. Although the visibility support apparatuses for automobiles were described, visibility support apparatuses according to the present invention may be applied to medical care, biorecognition, or the like, which is other than automobiles.

Embodiments and examples according to the present invention were described above. However, the above-disclosed embodiments and examples according to the present invention are mere examples and the scope of the present invention is not restricted to these embodiments. The scope of the present invention is indicated by Claims and embraces all the modifications within the meaning and range of equivalency of the Claims.

INDUSTRIAL APPLICABILITY

According to the present invention, a light-receiving element can be provided in which the light-receiving sensitivity covers the near-infrared region, a good crystal quality tends to be achieved, a one-dimensional or two-dimensional array of the light-receiving elements can be readily formed with a high accuracy, and dark current can be decreased to a low value; and a light-receiving element array in which the light-receiving elements are arranged can be provided. In addition, an image pickup device and a visibility support apparatus according to the present invention use cosmic light in the SWIR band as a light source and can receive the entire region of the cosmic light and do not receive light over a band that is unnecessarily wide, resulting in increased dark current. Accordingly, dark current and black dots can be suppressed, clear images can be captured, and mounting space and production cost can be reduced. In addition, an InP window layer can be used, a good sensitivity covering the entire region of cosmic light is achieved, and dark current can be reduced to a lower value to thereby provide clear images.

What is claimed is:

1. An image pickup device comprising a two-dimensional array of pixels that are semiconductor light-receiving elements made of group III-V semiconductors formed on an InP substrate, the image pickup device being configured to capture an image of an object by receiving light in a near-infrared region reflected by the object,
wherein each of the semiconductor light-receiving elements includes a light-receiving layer that is formed on the InP substrate and has a multi-quantum well structure composed of group III-V semiconductors; and a diffusion concentration distribution control layer made of group III-V semiconductors is disposed in contact with the light-receiving layer on a side of the light-receiving layer so as to be opposite the side adjacent to the InP substrate,
the light-receiving layer has a band gap wavelength of 1.65 to 3 μm,
the diffusion concentration distribution control layer has a lower band gap energy than InP,
a pn junction is formed for each of the pixels by selective diffusion of an impurity element, and
the concentration of the impurity element selectively diffused in the diffusion concentration distribution control layer is decreased to be $5 \times 10^{16}$/cm$^3$ or less toward the light-receiving layer.

2. The image pickup device according to claim 1, the concentration of the impurity element in the region located adjacent to a surface of the diffusion concentration distribution control layer opposite the surface in contact with the light-receiving layer being $1 \times 10^{18}$/cm$^3$ or more.

3. The image pickup device according to claim 1, wherein a pile-up of selectively diffused impurity element presents at the boundary between the diffusion concentration distribution control layer and the light-receiving layer.

4. The image pickup device according to claim 1, wherein the multi-quantum well structure is a type II GaAsSb/InGaAs multi-quantum well structure or a type II GaAsSb/InGaAsN (P, Sb) multi-quantum well structure.

5. The image pickup device according to claim 1, wherein the impurity element is zinc (Zn) and the diffusion concentration distribution control layer is composed of InGaAs.

6. The image pickup device according to claim 1, wherein the InP substrate is an off-angle substrate that is inclined by 5° to 20° in [111] direction or [11-1] direction with respect to (100).

7. The image pickup device according to claim 1, wherein two parts freely selected from the InP substrate, layers constituting the quantum well structure of the light-receiving layer, and the diffusion concentration distribution control layer satisfy a lattice matching degree (|Δa/a|, where a represents a lattice constant and Δa represents a difference between lattice constants of the two parts) of 0.002 or less.

8. The image pickup device according to claim 1, wherein the image pickup device is configured to receive light in a wavelength range of 1 to 3 μm.

9. The visibility support apparatus according to claim 8, not comprising means for radiating infrared light, near-infrared light, or visible light.

10. A visibility support apparatus comprising the image pickup device according to claim 1.

11. A visibility support apparatus used for enhancing vision from a vehicle, the visibility support apparatus comprising image capturing means for capturing a forward vision image or a rear vision image of the vehicle and display means for displaying the image captured by the image capturing means, wherein the image pickup device according to claim 1 is used as the image capturing means.

12. The visibility support apparatus according to claim 11, further comprising control means for driving and controlling the image capturing means and/or the display means.

13. The night vision device according to claim 12, not comprising means for radiating infrared light, near-infrared light, or visible light.

14. A night vision device that is an optical apparatus allowing visualization of an object at night, the night vision device comprising the image pickup device according to claim 1.

15. A navigation support apparatus mounted on a ship, the navigation support apparatus comprising an optical device for recognizing another ship as a target, wherein the image pickup device according to claim 1 is used as the optical device.

16. The monitoring device according to claim 15, not comprising means for radiating infrared light, near-infrared light, or visible light.

17. A monitoring device disposed at a stationary point, the monitoring device comprising an optical device for monitoring a surveillance subject, wherein the image pickup device according to claim 1 is used as the optical device.

* * * * *